US011380864B2

(12) United States Patent
Takahashi et al.

(10) Patent No.: US 11,380,864 B2
(45) Date of Patent: Jul. 5, 2022

(54) ELECTRONIC DEVICE, DISPLAY APPARATUS, PHOTOELECTRIC CONVERSION APPARATUS, ELECTRONIC APPARATUS, ILLUMINATION APPARATUS, AND MOVING OBJECT

(71) Applicant: CANON KABUSHIKI KAISHA, Tokyo (JP)

(72) Inventors: Tetsuo Takahashi, Kawasaki (JP); Norifumi Kajimoto, Zama (JP); Koji Ishizuya, Fujisawa (JP); Hiroaki Sano, Chofu (JP); Hiroyuki Mochizuki, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 10 days.

(21) Appl. No.: 16/785,300

(22) Filed: Feb. 7, 2020

(65) Prior Publication Data

US 2020/0259113 A1 Aug. 13, 2020

(30) Foreign Application Priority Data

Feb. 13, 2019 (JP) .............................. JP2019-023783
Nov. 20, 2019 (JP) .............................. JP2019-210033

(51) Int. Cl.
*H01L 51/52* (2006.01)
*H01L 51/50* (2006.01)
(Continued)

(52) U.S. Cl.
CPC ...... *H01L 51/5237* (2013.01); *H01L 27/3234* (2013.01); *H01L 51/5056* (2013.01); *H01L 51/5072* (2013.01); *H01L 51/56* (2013.01)

(58) Field of Classification Search
CPC ............. H01L 51/5237; H01L 27/3234; H01L 51/5056; H01L 51/5072; H01L 51/56
(Continued)

(56) References Cited

U.S. PATENT DOCUMENTS

2002/0113248 A1* 8/2002 Yamagata ........... H01L 51/5203
257/187
2006/0214152 A1* 9/2006 Seo ..................... H01L 27/3209
257/13
(Continued)

FOREIGN PATENT DOCUMENTS

JP 2007073608 A 3/2007

*Primary Examiner* — Dzung Tran
(74) *Attorney, Agent, or Firm* — Canon U.S.A., Inc. I.P. Division

(57) ABSTRACT

The present disclosure provides an electronic device including a plurality of first electrodes, a second electrode, a functional layer disposed between each first electrode and the second electrode, and an insulating layer having a slope portion on the first electrode, wherein the functional layer is continuously disposed so as to cover the first electrode, a neighboring first electrode, and the insulating layer covering the first electrode and the neighboring first electrode, the functional layer on the first electrode has a layer thickness smaller than a height from an upper surface of the first electrode to an upper surface of the insulating layer, and the functional layer on the slope portion of the insulating layer has a layer thickness of 20 nm or more in a direction perpendicular to a slope surface of the slope portion.

19 Claims, 13 Drawing Sheets

(51) Int. Cl.
*H01L 27/32* (2006.01)
*H01L 51/56* (2006.01)

(58) Field of Classification Search
USPC .......................................................... 257/40
See application file for complete search history.

(56) References Cited

U.S. PATENT DOCUMENTS

| | | | | |
|---|---|---|---|---|
| 2009/0058283 | A1* | 3/2009 | Tanaka ................. | H01L 51/5218 |
| | | | | 313/504 |
| 2010/0102335 | A1* | 4/2010 | Takagi ................. | H01L 27/3276 |
| | | | | 257/88 |
| 2012/0326201 | A1* | 12/2012 | Ohnuma ............. | H01L 27/3246 |
| | | | | 257/99 |
| 2016/0013437 | A1* | 1/2016 | Ohnuma ............. | H01L 27/3246 |
| | | | | 257/99 |

* cited by examiner

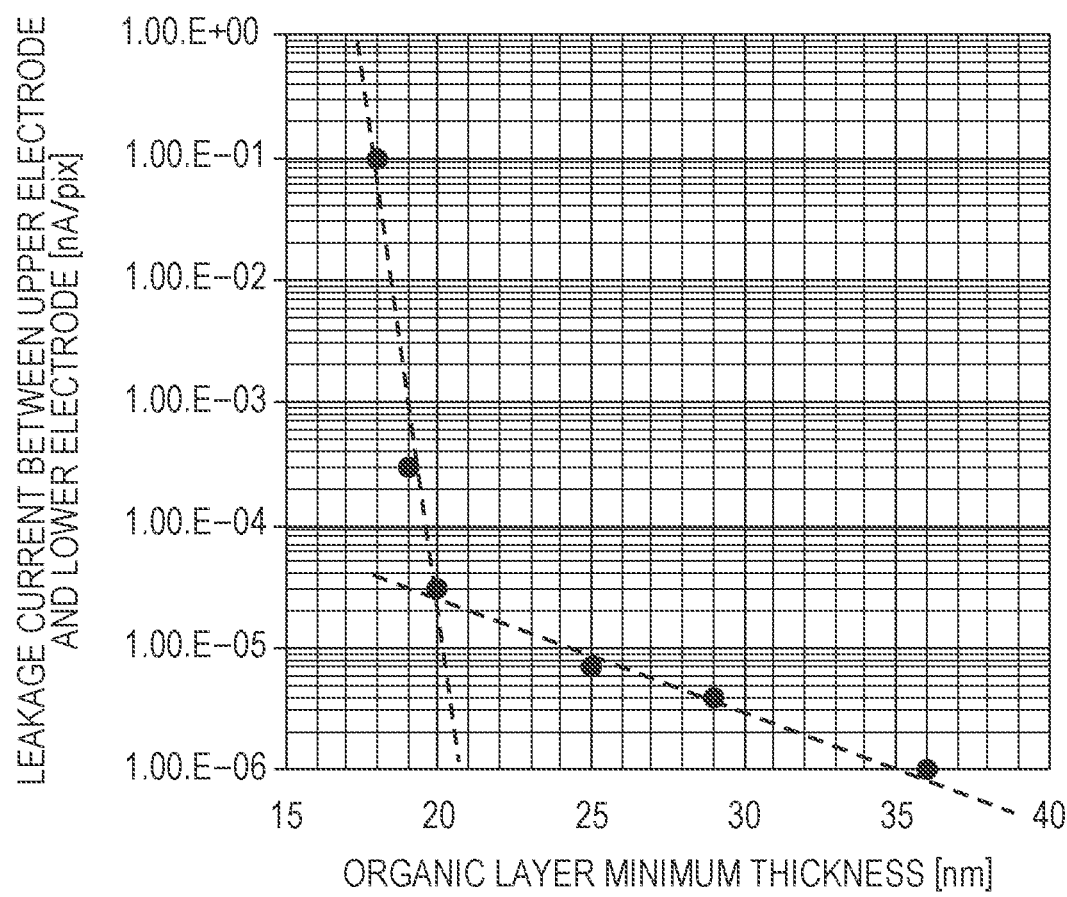

ELECTRONIC DEVICE, DISPLAY APPARATUS, PHOTOELECTRIC CONVERSION APPARATUS, ELECTRONIC APPARATUS, ILLUMINATION APPARATUS, AND MOVING OBJECT

BACKGROUND OF THE DISCLOSURE

Field of the Disclosure

The present disclosure relates to an electronic device, a display apparatus, a photoelectric conversion apparatus, an electronic apparatus, an illumination apparatus, and a moving object.

Description of the Related Art

As electronic devices including an organic layer, organic light emitting elements and organic photoelectric conversion elements have been proposed. Organic light emitting elements are elements that include an upper electrode, a lower electrode, and an organic layer disposed therebetween, and are configured to excite an organic compound included in the organic layer to thereby emit light. In recent years, electronic devices including an organic light emitting element have been attracting attention. In particular, display apparatuses are widely used.

There are known modes of forming organic layers of organic light emitting elements: a mode of forming organic layers having different configurations for individual emission colors, and a mode of forming organic layers having the same configuration for different emission colors. In the mode of forming organic layers having the same configuration for different emission colors, an organic layer is typically formed so as to continuously extend for a plurality of light emitting elements. Even in the case of forming organic layers having different configurations for individual emission colors, some of the organic layers may be formed so as to continuously extend for a plurality of light emitting elements.

However, in such a structure in which organic layers continuously extend for a plurality of light emitting elements and between a plurality of light emitting elements, current tends to leak via organic layers between adjacent light emitting elements. The leakage current between light emitting elements causes unintentional emission from light emitting elements. The unintentional emission from light emitting elements narrows color gamut, which indicates the display performance of the display apparatus.

In a photoelectric conversion element including an organic layer, an organic photoelectric conversion layer is disposed so as to continuously extend to cover a plurality of lower electrodes. In this case, leakage current flows via the organic photoelectric conversion layer between the plurality of lower electrodes, which may result in generation of noise.

When such an organic layer is formed as a thin layer, leakage current between the lower electrodes can be reduced. However, when the organic layer is thin, leakage current tends to flow between an upper electrode and a lower electrode. Japanese Patent Laid-Open No. 2007-73608 discloses, in order to reduce short circuits between an upper electrode and a lower electrode, a display apparatus in which an organic layer has, in a pixel peripheral area near the rib for dividing pixels, a larger layer thickness than in a pixel central area.

Further, Japanese Patent Laid-Open No. 2007-73608 describes the relation between the layer thickness of the organic layer in the pixel central area and the layer thickness of the organic layer in the pixel peripheral area, but does not describe, on a slope portion of the rib for dividing pixels, the layer thickness of the organic layer measured in a direction perpendicular to the slope portion. The control of the ratio of the thickness of the organic layer in the pixel central area to the thickness of the organic layer in the pixel peripheral area alone is insufficient for a reduction in the leakage current between the upper electrode and the lower electrode due to, on the slope portion of the rib for dividing pixels, the layer thickness of the organic layer measured in a direction perpendicular to the slope portion.

SUMMARY OF THE DISCLOSURE

The present disclosure provides an electronic device including a plurality of first electrodes in which leakage current between the plurality of first electrodes is reduced, and leakage current between such a first electrode and a second electrode is reduced.

An electronic device according to an embodiment of the present disclosure includes a first lower electrode; a second lower electrode; an upper electrode; a functional layer disposed between each lower electrode and the upper electrode, and covering each lower electrode; and an insulating layer covering an edge of each lower electrode, and including a slope portion on each lower electrode, wherein each lower electrode includes a first region including the edge of the lower electrode and covered with the insulating layer, and a second region in contact with the functional layer, the functional layer is continuously disposed so as to cover the second region of the first lower electrode, the second region of the second lower electrode, and the insulating layer covering the first lower electrode and the second lower electrode, the functional layer has, on the second region, a layer thickness smaller than a height from an upper surface of the first lower electrode to an upper surface of the insulating layer, and the functional layer on the slope portion of the insulating layer has a layer thickness of 20 nm or more in a direction perpendicular to a slope surface of the slope portion.

Further features of the present disclosure will become apparent from the following description of example embodiments with reference to the attached drawings.

BRIEF DESCRIPTION OF THE DRAWINGS

FIG. 13 is a graph of leakage current between an upper electrode and a lower electrode against the layer thickness of the thinnest portion of an organic layer on a slope portion measured in a direction perpendicular to the slope portion.

DESCRIPTION OF THE EMBODIMENTS

Figure 1:
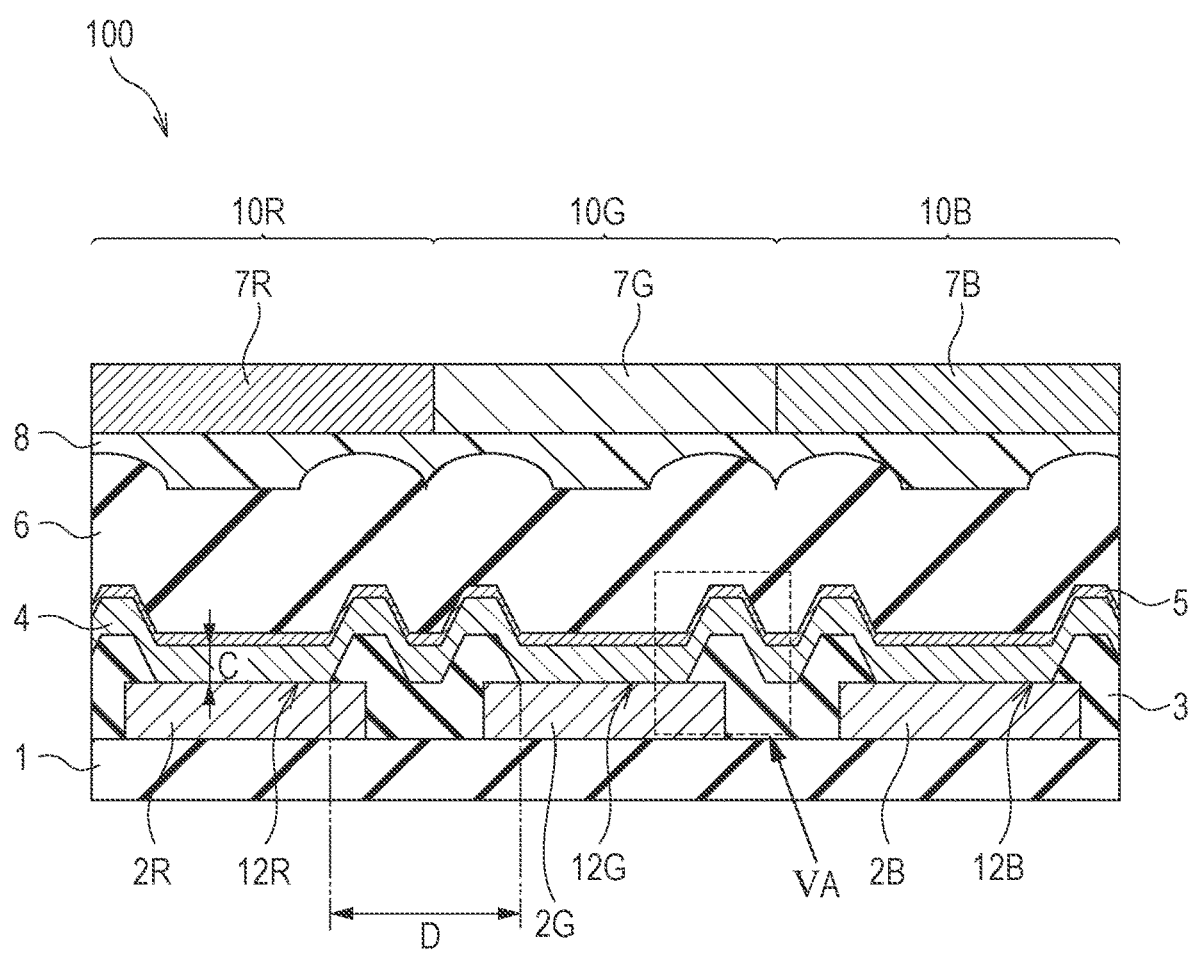
FIG. 1 is a schematic sectional view of the configuration of an organic device according to a first example embodiment of the present disclosure.

An electronic device according to an embodiment of the present disclosure includes a first lower electrode; a second lower electrode; an upper electrode; a functional layer disposed between each lower electrode and the upper electrode, and covering each lower electrode; and an insulating layer covering an edge of each lower electrode, and including a slope portion on each lower electrode, wherein each lower electrode includes a first region including the edge of the lower electrode and covered with the insulating layer, and a second region in contact with the functional layer, the functional layer is continuously disposed so as to cover the second region of the first lower electrode, the second region of the second lower electrode, and the insulating layer covering the first lower electrode and the second lower electrode, the functional layer has, on the second region, a layer thickness smaller than a height from an upper surface of the first lower electrode to an upper surface of the insulating layer, and the functional layer on the slope portion of the insulating layer has a layer thickness of 20 nm or more in a direction perpendicular to a slope surface of the slope portion.

An electronic device according to an embodiment of the present disclosure includes an element including a first electrode, a second electrode, a functional layer disposed between the first electrode and the second electrode, and an insulating layer covering an edge of the first electrode.

As described above, in the electronic device including a plurality of first electrodes in which leakage current between the first electrodes is reduced, the functional layer on the slope portion of the insulating layer has a layer thickness of 20 nm or more, to thereby reduce leakage current between such a first electrode and the second electrode.

This effect of reducing leakage current provided by setting the thickness of the functional layer as described above is strong in the case where the functional layer has a layer thickness smaller than the height of insulating layers covering edges of the plurality of first electrodes, in other words, in the case where the functional layer is thin. The effect is also strong in the case where the functional layer is continuously formed for a plurality of elements, in other words, in the case where the functional layer is formed as a continuous layer.

When the electronic device includes an organic light emitting element, by forming the functional layer, namely, the organic layer, so as to have a small layer thickness, light emission efficiency can be improved. This is achieved by a reduction in the amount of light absorbed by the organic layer. A distance L between a pair of electrodes of the organic light emitting element can satisfy Formula (1) below. When the organic light emitting element satisfies Formula (1) below, constructive optical interference between electrodes is caused, which results in a further increase in the light emission efficiency of the organic light emitting element. The light emission efficiency here can also be referred to as extraction efficiency.

$$(\lambda/8) \times (-(2\phi/\pi)-1) < L < (\lambda/8) \times (-(2\phi/\pi)+1) \tag{1}$$

In Formula (1), $\lambda$ represents the wavelength of a maximum peak in an emission spectrum of light emitted from the light emitting layer included in the organic layer. The maximum peak is, among peaks in the emission spectrum, a peak having the highest intensity. The wavelength of this peak may be the shortest wavelength among peaks included in the emitted light. $\phi$ represents a phase shift at an electrode. The phase shift occurs upon reflection of light. One of the first electrode and the second electrode may be a reflective electrode, and the other may be a light transmission electrode. The light transmission electrode may be an electrode that transmits a portion of light and reflects the other portion of light.

An element of an electronic device according to an embodiment of the present disclosure may be an organic light emitting element. When the element is an organic light emitting element, the functional layer may be an organic layer including a light emitting layer. Alternatively, the element may be a photoelectric conversion element. When the element is a photoelectric conversion element, the functional layer may be an organic layer including a photoelectric conversion layer.

The first electrode includes a first region covered with an insulating layer and including an edge of the first region, and a second region not covered with the insulating layer and being in contact with the functional layer. The first region may surround the second region.

In an organic light emitting device according to an embodiment of the present disclosure, an organic layer 4 can have, on the second region of each first electrode, a layer thickness of less than 100 nm. This tends to provide higher luminance, and provides a stronger effect of reducing leakage current between the first electrode and the second electrode due to the present disclosure.

Hereinafter, specific examples of an electronic device according to an embodiment of the present disclosure will be described with reference to the attached drawings. In the following descriptions and drawings, constituent elements shared by a plurality of drawings are denoted by the same reference signs. Thus, after constituent elements shared by a plurality of drawings are described, descriptions of the constituent elements denoted by the same reference signs will be appropriately omitted.

First Example Embodiment

Figure 2:
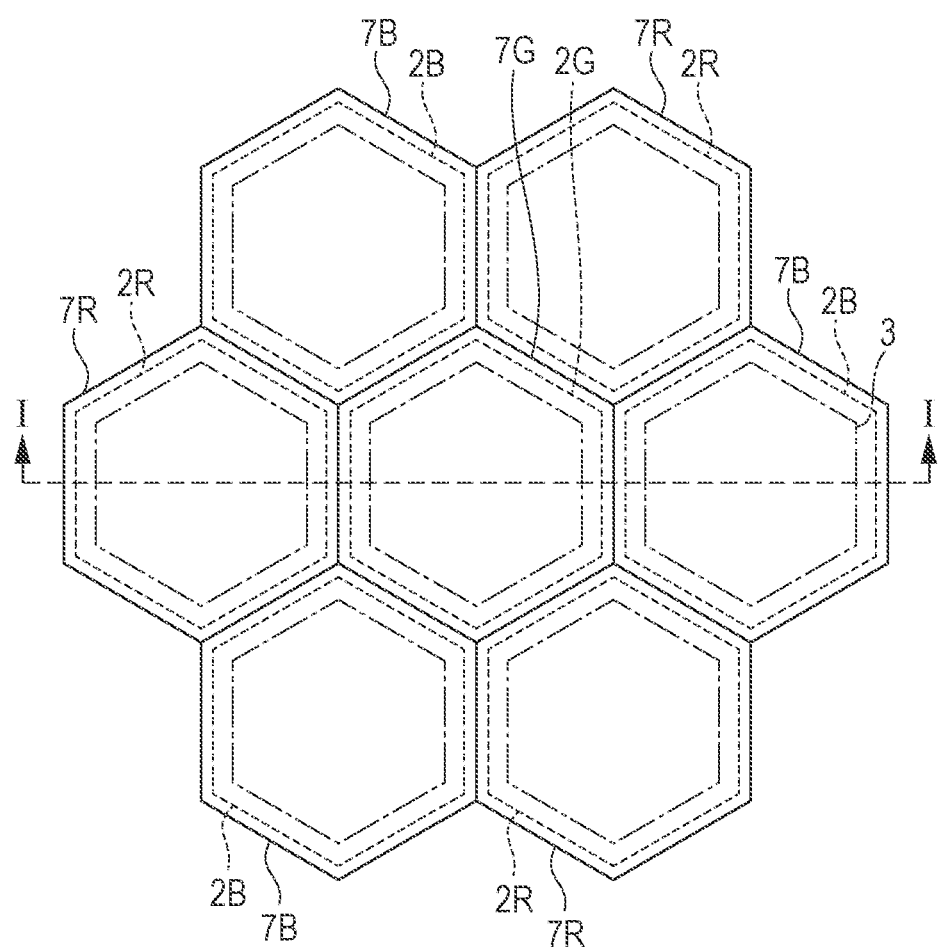
FIG. 2 is a schematic plan view of an example configuration of the organic device in FIG. 1.

A first embodiment relates to an example in which the electronic device is an organic light emitting device. FIG. 1 is a schematic sectional view of an organic light emitting device 100 according to the first embodiment of the present disclosure. FIG. 2 is a top view of the organic light emitting device 100. A section taken along line I-I in FIG. 2 corresponds to FIG. 1. Three elements 10 constitute a single pixel. In this embodiment, such pixels are arranged in a delta array serving as a non-limiting example. Alternatively, the pixels may be arranged in a stripe array or a square array.

The organic light emitting device 100 includes a substrate 1 and a plurality of light emitting elements 10 disposed on the upper surface (first surface) of the substrate 1. FIG. 1 illustrates, among the plurality of light emitting elements 10 included in the organic light emitting device 100, three light emitting elements 10R, 10G, and 10B. The symbol "R" of 10R means that the element is configured to emit red light. Similarly, 10G and 10B respectively denote elements configured to emit green light and blue light. In this Specification, in the case of referring to, among the plurality of light emitting elements 10, a specific light emitting element, the reference number 10 is suffixed with a reference character, for example, a light emitting element 10"R"; alternatively, in the case of generally referring to any light emitting element 10, the element is simply referred to as a light emitting element "10". The same applies to other constituent elements.

The plurality of light emitting elements 10 include, in ascending order from the upper surface of the substrate 1, lower electrodes 2 (first electrodes) divided by an insulating layer 3 so as to correspond to light emitting elements; an organic layer 4 including a light emitting layer covering the lower electrodes 2 and the insulating layer 3; and an upper electrode 5 (second electrode) covering the organic layer 4. The organic light emitting device 100 according to this embodiment is a top emission device configured to extract light from the upper electrode 5. The organic light emitting device 100 further includes a protective layer 6 disposed so as to cover the upper electrode 5, and a plurality of color filters 7 disposed on the protective layer 6 so as to individually correspond to the plurality of light emitting elements 10. In this embodiment, the organic layer 4 emits white light, and color filters 7R, 7G, and 7B separate the white light emitted from the organic layer 4 into RGB components, respectively. Alternatively, the color filters may be color conversion layers configured to absorb light from the organic layer and convert its color to other colors. In case where the lower electrode comprises a plurality of lower electrodes, the plurality of the lower electrodes may comprise a first lower electrode and a second lower electrode.

In this Specification, the terms "upper" and "lower" respectively denote upper and lower in FIG. 1. Of the main surfaces of the substrate 1, a surface on which the lower electrodes 2 and other constituent elements are disposed is referred to as the "upper" surface. The term "height" is basically a distance measured upward from the upper surface (first surface) of the substrate 1. Alternatively, the "height" may be defined relative to a portion level with the upper surface (first surface) of the substrate 1.

In FIG. 1, the reference sign 1 denotes a constituent element simply referred to as a substrate; the substrate may be an insulator disposed between the first electrode and a drive circuit including a transistor connected to the first electrode. The insulator is, for example, an interlayer insulating layer formed of an inorganic substance such as silicon oxide or silicon nitride or an organic substance such as polyimide or polyacrylate. The interlayer insulating layer may also be referred to as a planarization layer because it is used to reduce irregularities of the surface on which the first electrodes are to be formed.

The lower electrodes 2 may be formed of a metal material having a reflectance of 80% or more for the emission wavelength of the organic layer 4. For example, the lower electrodes 2 may be formed of a metal such as Al or Ag, or an alloy of the foregoing metal containing, for example, Si, Cu, Ni, or Nd. The term "emission wavelength" means the spectral range of light emitted from the organic layer 4. As long as the lower electrodes 2 have a high reflectance for the emission wavelength of the organic layer 4, the lower electrodes 2 may have a stack structure including a barrier layer. The barrier layer may be formed of a metal such as Ti, W, Mo, or Au or an alloy of the foregoing metal. The barrier layer may be a metal layer disposed at the upper surface of such a lower electrode. The upper surface of a lower electrode 2R is a reflection surface 12R. The reflection surface may reflect light emitted from the organic layer. Similarly, the other pixels include 12G and 12B.

The insulating layer 3 may be disposed between the lower electrode and the functional layer so as to cover an edge of the lower electrode. The lower electrode may include a first region covered with the insulating layer, and a second region not covered with the insulating layer but covered with the organic layer. Stated another way, the second region is in contact with the organic layer. The second region is also referred to as an opening. This is because, in a top view, the second region can be regarded as a recess formed using the insulating layer. Such second regions serve as light emission areas of the light emitting elements 10. Thus, when viewed from the top, the shape of such a light emission area may be defined by the insulating layer. The insulating layer is not limited to the shape illustrated in FIG. 1 as long as it achieves insulation among the first electrodes of the light emitting elements.

The insulating layer 3 may include, in its upper portion, a slope portion. This upper portion is positioned on the side opposite from the substrate, in other words, on the side closer to the functional layer.

The insulating layer 3 may be formed by, for example, chemical vapor deposition (CVD) or physical vapor deposition (PVD). The insulating layer 3 may be formed of, for example, silicon nitride (SiN), silicon oxynitride (SiON), or silicon oxide (SiO). The insulating layer 3 may be a stack of films formed of such materials. The slope angle of the slope portion of the insulating layer may be controlled by adjusting conditions of anisotropic etching or isotropic etching. The slope angle of a layer immediately below the insulating layer 3 may be controlled, to thereby control the slope angle in the insulating layer 3. The insulating layer 3 may have, in its upper surface, irregularities formed by, for example, processing such as etching or stacking of another layer.

The organic layer 4 is disposed between the lower electrode 2 and the upper electrode 5. The organic layer 4 may be continuously formed on the upper surface of the substrate 1, and shared by the plurality of light emitting elements 10. Stated another way, the single organic layer is shared by the plurality of light emitting elements. The organic layer 4 may be formed as a single layer over the whole surface of the display area for displaying images in the organic light emitting device 100. The organic layer 4 may include a hole transport layer, a light emitting layer, and an electron transport layer. The material for the organic layer 4 can be appropriately selected in accordance with a viewpoint such as light emission efficiency, operating lifetime, or optical interference. The hole transport layer may also function as an electron blocking layer or a hole injection layer, or may be provided as a stack structure of a hole injection layer, a hole transport layer, and an electron blocking layer, for example. The light emitting layer may have a stack structure of light emitting layers configured to emit light of different colors, or may be a mixture layer including a mixture of emission dopants configured to emit light of different colors.

The electron transport layer may also function as a hole blocking layer or an electron injection layer, or may have a stack structure of an electron injection layer, an electron transport layer, and a hole blocking layer.

A region between the light emitting layer and one of the upper electrode and the lower electrode functioning as an anode serves as a hole transport region; and a region between the other electrode functioning as a cathode and the light emitting layer serves as an electron transport region. The hole transport region and the electron transport region are collectively referred to as a charge transport region.

The organic light emitting device 100 may include a plurality of light emitting layers, and may include an intermediate layer between the plurality of light emitting layers. The organic light emitting device 100 may be an organic light emitting device having a tandem structure in which the intermediate layer is a charge generating layer. In the tandem configuration, a transport layer such as a hole transport layer or an electron transport layer may be formed between the intermediate layer and such a light emitting layer.

The upper electrode 5 is disposed on the organic layer 4. The upper electrode 5 is continuously formed over a plurality of elements, and is shared by the plurality of light emitting elements 10. As with the organic layer 4, the upper electrode 5 may be formed as a single layer over the whole surface of the display area for displaying images in the organic light emitting device 100. The upper electrode 5 may be an electrode that transmits at least a portion of light having reached the lower surface of the upper electrode 5. The upper electrode may function as a semi-transmissive reflective layer that transmits a portion of light and reflects the other portion (namely, semi-transmissive reflectivity). The upper electrode 5 may be formed of, for example, a metal such as magnesium or silver, an alloy including magnesium or silver as a main component, or an alloy material including an alkali metal or an alkaline earth metal. Alternatively, the upper electrode 5 may be formed of an oxide conductor, for example. Alternatively, the upper electrode 5 may have a stack structure as long as it has an appropriate transmittance.

The protective layer 6 may be formed of, for example, a material having a low permeability to external oxygen or moisture, such as silicon nitride, silicon oxynitride, aluminum oxide, silicon oxide, or titanium oxide. The silicon nitride and silicon oxynitride may be formed by, for example, CVD. On the other hand, the aluminum oxide, silicon oxide, and titanium oxide may be formed by atomic layer deposition (ALD). The combination of the material and the production method for the protective layer is not limited to the above-described examples. The protective layer may be produced in consideration of, for example, the thickness of the layer to be formed, and the time for the formation. The protective layer 6 may have a monolayer structure or a stack structure as long as it transmits light having passed through the upper electrode 5, and has sufficiently high moisture barrier performance.

The color filters 7 are formed over the protective layer 6. As illustrated in FIG. 1, the color filters 7 may be in contact with each other without gaps, such as a color filter 7R and a color filter 7G. Alternatively, a color filter may be disposed so as to overlap a color filter of another color. The color filters may have a planarization layer 8 between the protective layer and the color filters. The color filters may have another planarization layer over the color filters. The planarization layer over the color filters and the planarization layer under the color filters may be formed of the same material. Examples of the material for these planarization layers include acrylic resins, epoxy resins, and polyimide resins.

The organic layer 4 above the lower electrode 2R has a layer thickness C, which is the thickness of the organic layer measured in a direction perpendicular to the lower electrode. A distance D from the opening of the lower electrode 2R to the opening of the lower electrode 2G is the shortest distance between edges of the openings.

An electronic device according to an embodiment of the present disclosure may have a ratio of the distance between the opening of a first electrode to the opening of a neighboring first electrode to the layer thickness of the organic layer on the first electrodes, the ratio being less than 50. Such an organic light emitting device that satisfies this numerical range is a device in which the light emitting elements are arranged at such a high density that leakage current between the light emitting elements can pose a problem. The reason for this is as follows.

Figure 3:
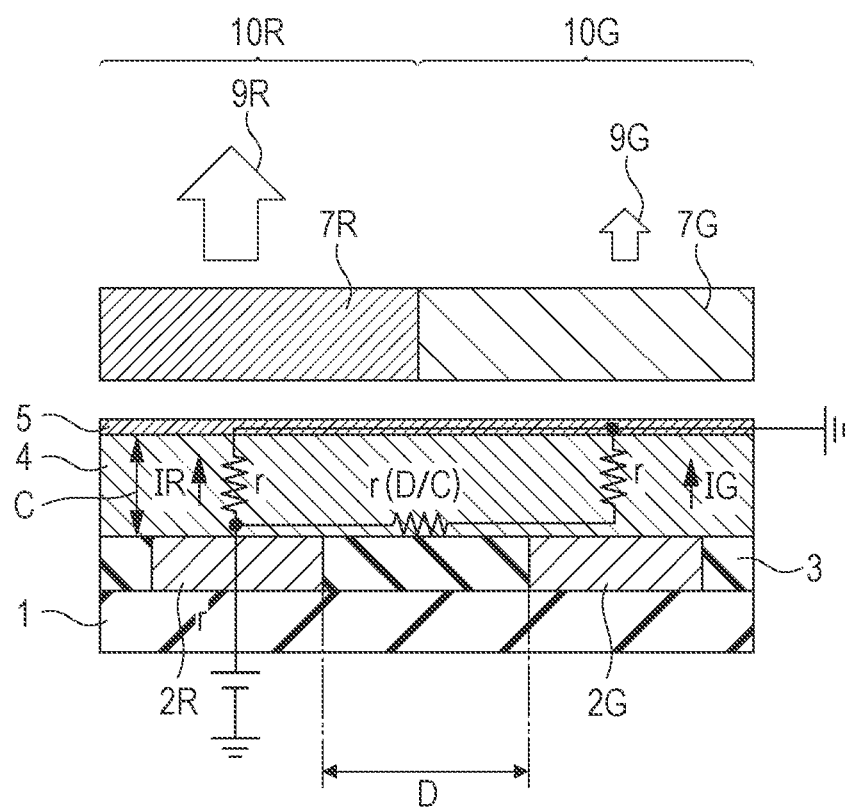
FIG. 3 is a schematic view and circuit diagram of an example organic light emitting device according to an embodiment.

FIG. 3 is a schematic view of an organic light emitting device including a light emitting element 10R provided with a red color filter 7R and a light emitting element 10G provided with a green color filter 7G. The difference from FIG. 1 is that the insulating layers do not have the slope portions, so that a reduction in the leakage current between elements is not achieved. The equivalent circuit of the light emitting element 10R is superimposed on the schematic view. The equivalent circuit indicates the resistance of the organic layer in FIG. 3, but does not indicate incorporation of the electronic circuit. In addition, in order to explain the leakage current between the light emitting elements, the equivalent circuit of the light emitting element 10G is also illustrated.

When the thickness of the organic layer on the lower electrode 2R is denoted by C, the distance between the openings of the lower electrode 2R and the lower electrode 2G is denoted by D, and a resistance (in the thickness direction) per unit area of the organic layer is denoted by r, a resistance (in the horizontal direction) per unit area of the organic layer is expressed by r(D/C). In this case, when a current flowing through the light emitting element 10R is denoted by $I_R$, and a current flowing through the light emitting element 10G is denoted by $I_G$, the following relation holds.

$$I_G/I_R = 1/(1+D/C) \tag{2}$$

Specifically, even in the case of trying to cause emission 9R only from the red light emitting element 10R, current also flows through the green light emitting element 10G to cause emission 9G, which depends on D/C.

In the case of causing, with the same amount of current, emission from the red light emitting element 10R and emission from the green light emitting element 10G where the emission spectrum of the red light emitting element 10R alone is denoted by $S_R$ and the emission spectrum of the green light emitting element 10G alone is denoted by $S_G$, an emission spectrum $S_{R+G}$ in consideration of the leakage current between the light emitting elements is expressed by the following Formula (3).

$$S_{R+G} = S_R + S_G(I_G/I_R) \tag{3}$$

Figure 4:
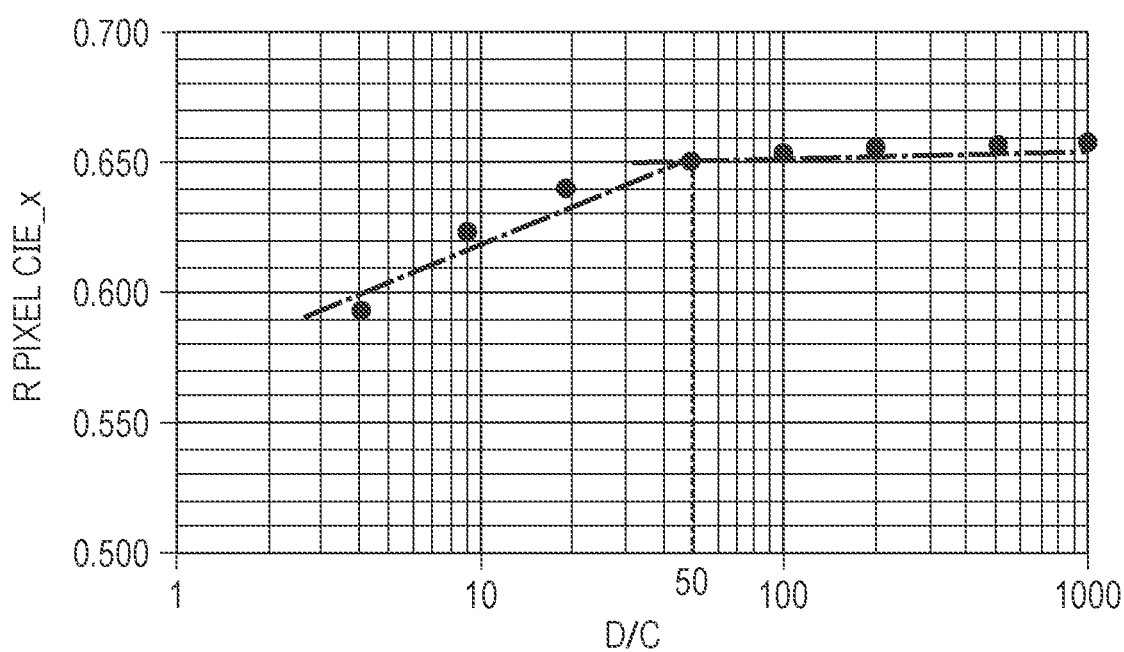
FIG. 4 is a graph of the chromaticity of a red pixel to a ratio of the distance between openings of two adjacent first electrodes to the layer thickness of the organic layer on the first electrodes.

The chromaticity coordinates of $S_{R+G}$ in CIExy space are calculated, and a graph in which the x value is plotted on the ordinate, and D/C is plotted on the abscissa is illustrated in FIG. 4. In FIG. 4, the x-coordinate varies, which means that, in addition to the intended emission of red light, green light is also emitted. Thus, in FIG. 4, the x-coordinate that is small means flowing of leakage current to the neighboring pixel. When D/C is 50 or more, the x value substantially does not vary. Specifically, even in the case where the insulating layers do not have the slope portions and leakage current tends to flow between light emitting elements, when D/C is 50 or more, the leakage current between light emitting elements may not pose a problem. On the other hand, when D/C is less than 50, the x value considerably decreases, so that the red color purity decreases noticeably; this case corresponds to an organic light emitting device in which light emitting elements are arranged at such a high density that leakage current between light emitting elements can pose a problem. Thus, in such a case where D/C is less than 50, the organic light emitting device according to this embodiment provides a particularly strong effect of reducing leakage current.

The optical distance between a pair of electrodes of an organic light emitting device according to an embodiment of the present disclosure may provide a constructive interference structure. The constructive interference structure can also be referred to as a resonance structure.

In the light emitting elements, organic layers can be formed so as to satisfy constructive optical interference conditions, so that optical interference provides enhanced extraction light from the organic light emitting device. When optical conditions for providing enhanced extraction light in the front direction are satisfied, light is radiated in the front direction at higher efficiency. Light enhanced by optical interference is known to have an emission spectrum having a smaller half width than the pre-interference emission spectrum. Thus, a higher color purity is achieved. In designing of the organic light emitting device for light of wavelength $\lambda$, a distance $d_0$ from the emission position of the light emitting layer to the reflection surface of the reflective material is adjusted so as to satisfy $d_0 = i\lambda/4n_0$ ($i=1, 3, 5$, etc.) to thereby provide constructive interference.

This results in an increase in the amount of front direction component in the emission distribution of light of wavelength $\lambda$, which results in an increase in the front luminance. Incidentally, $n_0$ represents the refractive index (for wavelength $\lambda$) of a layer from the emission position to the reflection surface.

An optical distance $Lr$ from the emission position to the reflection surface of the light reflective electrode is expressed by the following Formula (4) where the sum of phase shift amount upon reflection of light of wavelength $\lambda$ at the reflection surface is denoted by $\phi r$ [rad]. Incidentally, the optical distance L is the sum of the product of the refractive index $nj$ and thickness $dj$ of each layer of the organic layer. Thus, L can be expressed by $\Sigma nj \times dj$, or by $n0 \times d0$. Incidentally, $\phi$ is a negative value.

$$Lr = (2m - (\phi r/\pi)) \times (\lambda/4) \quad (4)$$

In Formula (4) above, m is an integer of 0 or more. Incidentally, in the case of $\phi = -\pi$, $m=0$ results in $L = \lambda/4$, and $m=1$ results in $L = 3\lambda/4$. Hereafter, the condition of $m=0$ in Formula (4) above will be referred to as the $\lambda/4$ interference condition, and the condition of $m=1$ in Formula (4) above will be referred to as the $3\lambda/4$ interference condition.

An optical distance $Ls$ from the emission position to the reflection surface of the light extraction electrode is expressed by the following Formula (5) where the sum of phase shift upon reflection of light of wavelength $\lambda$ at the reflection surface is denoted by $\phi s$ [rad]. In the following Formula (5), m' is an integer of 0 or more.

$$Ls = (2m' - (\phi s/\pi)) \times (\lambda/4) = -(\phi s/\pi) \times (\lambda/4) \quad (5)$$

Thus, all layer interference L is expressed by the following Formula (6).

$$L = (Lr + Ls) = (2m - (\phi/\pi)) \times (\lambda/4) \quad (6)$$

In this Formula, $\phi$ represents the sum of phase shift ($\phi r + \phi s$) upon reflection of light of wavelength $\lambda$ at the light reflective electrode and at the light extraction electrode.

In this case, actual light emitting elements are not necessarily designed so as to strictly satisfy Formula (6) above in consideration of, for example, viewing angle characteristics, which are a trade-off for the front extraction efficiency. Specifically, L may have errors of $\pm \lambda/8$ from the value satisfying Formula (6). The allowable errors of L from the interference condition may be 50 nm or more and 75 nm or less.

Thus, an organic light emitting device according to an embodiment of the present disclosure preferably satisfies the following Formula (7). More preferably, L is within $\pm \lambda/16$ from the value satisfying Formula (6), preferably satisfies the following Formula (7').

$$(\lambda/8) \times (4m - (2\phi/\pi) - 1) < L < (\lambda/8) \times (4m - (2\phi/\pi) + 1) \quad (7)$$

$$(\lambda/16) \times (8m - (4\phi/\pi) - 1) < L < (\lambda/16) \times (8m - (4\phi/\pi) + 1) \quad (7')$$

Light emitting elements according to an embodiment of the present disclosure can satisfy, in Formula (7) and Formula (7'), $m=0$ and $m'=0$, namely, the $\lambda/4$ optical interference condition. In this case, Formula (7) and Formula (7') give Formula (8) and Formula (8').

$$(\lambda/8) \times (-(2\phi/\pi) - 1) < L < (\lambda/8) \times (-(2\phi/\pi) + 1) \quad (8)$$

$$(\lambda/16) \times (-(4\phi/\pi) - 1) < L < (\lambda/16) \times (-(4\phi/\pi) + 1) \quad (8')$$

In Formula (7) and Formula (7'), when $m=0$ and $m'=0$, in the constructive interference structure, the organic layer has the smallest thickness. This results in a decrease in the driving voltage of the light emitting elements, to thereby achieve emission having higher luminance at a voltage below the upper limit of the power supply voltage. When the organic layer has a smaller thickness, leakage current tends to flow between the upper electrode and the lower electrode; in this case, satisfying features according to an embodiment of the present disclosure provides a particularly stronger effect of reducing leakage current between the upper electrode and the lower electrode.

The emission wavelength $\lambda$ may be the emission wavelength of a peak having the highest emission intensity. In general, emission from an organic compound has the highest intensity at the shortest wavelength peak among peaks within the emission spectrum; thus, the emission wavelength $\lambda$ may be the wavelength at the shortest wavelength peak.

An electronic device according to an embodiment of the present disclosure includes a functional layer having a small layer thickness. More specifically, the functional layer has, on the second region (of the first electrode) not covered with the insulating layer, a layer thickness smaller than the height of the insulating layer. The layer thickness of the functional layer can be estimated not only on the second region of the first electrode, but also on the upper surface of the insulating layer. In a device including a functional layer having such a small layer thickness that leakage current between elements can pose a problem, the functional layer is formed so as to have, in a region extending along the slope portion of the insulating layer, a layer thickness of 20 nm or more. The phrase "functional layer extending along the slope portion of the insulating layer" means a structure in which a line drawn so as to be perpendicular to the slope portion of the insulating layer reaches the slope portion of the functional layer.

In summary, in an electronic device according to an embodiment of the present disclosure, the functional layer on the second region of the first electrode has a layer thickness smaller than the height of the insulating layer, to thereby achieve a reduction in the leakage current to neighboring elements. Simultaneously, the functional layer on the slope portion of the insulating layer has a layer thickness of 20 nm or more, to thereby achieve a reduction in leakage current between the first electrode and the second electrode.

Figure 5A:
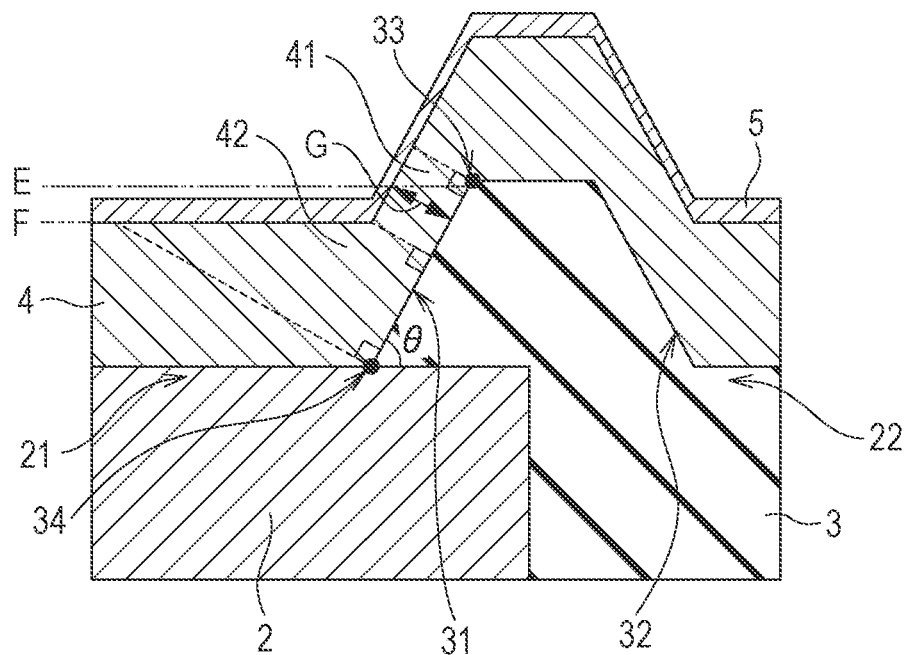
FIG. 5A is an enlarged view of the schematic sectional view illustrating the configuration of the organic light emitting device according to the first embodiment of the present disclosure.

FIG. 5A is an enlarged view of the dotted box VA in FIG. 1. FIG. 5A illustrates a second region 21 of the first electrode and a slope portion 31 of the insulating layer. The slope portion 31 of the insulating layer is a slope portion on the first region of the first electrode. The slope portion 31 can also be referred to as a slope portion in contact with the light emission area, or a slope portion forming the inner periphery of the opening. In plan view in a direction perpendicular to the substrate, the slope portion and the first region of the first electrode overlap. On the other hand, a slope portion 32 is a slope portion disposed, in plan view in a direction perpendicular to the substrate, between the first electrode and another first electrode. The slope portion 32 can also be referred to as a slope portion forming the outer periphery of the opening, or a slope portion between pixels. On the second region 21, a height F of the upper surface of the organic layer denotes the height of the upper surface of the organic layer formed substantially parallel to the second region 21. The organic layer on the second region can also be referred to as a flat portion of the organic layer on the first electrode.

An upper end 33 of the slope portion 31 of the insulating layer is a point where the insulating layer has an angle of 0°. The height of the upper end 33 of the slope portion 31 is denoted by E. The slope angle θ of the slope portion of the insulating layer may be constant at any point of the slope portion as illustrated in FIG. 5A; alternatively, the slope angle may vary depending on points of the slope portion. Even in such a case where the slope angle varies, regions having slope angles of more than 0° are regarded as being included in the same slope portion; points at both ends of the slope portion 31 where the slope angles are 0° are the upper end 33 and a lower end 34 of the slope portion 31. In the case of the planar structure illustrated in FIG. 2, the slope portion 31 is continuously formed so as to extend along all the sides of each hexagon.

The organic layer 4 has the upper surface having height F smaller than height E of the upper end 33 of the slope portion 31. This is because, in the organic light emitting device according to this embodiment, the organic layer has a layer thickness smaller than the height of the insulating layer. Specifically, as illustrated in FIG. 5A, the organic light emitting device according to this embodiment includes the organic layer extending along the slope portion of the insulating layer. This forms a region 41 (within the dotted box) of the organic layer extending along the slope portion 31. The region of the organic layer extending along the slope portion is formed substantially parallel to the slope portion; referring to the region 41 of the organic layer, this region is defined by lines drawn perpendicular to the insulating layer. In the case of the planar structure illustrated in FIG. 2, the region 41 of the organic layer extending along the slope portion 31 continuously extends along all the sides of each hexagon. Incidentally, the phrase "substantially parallel" means the following: when "parallel" is defined as a case where a slope angle at a point on the slope portion is equal to a slope angle at the upper surface of the organic layer 4 positioned where a line drawn from the point so as to be perpendicular to the slope portion intersects the upper surface of the organic layer 4, "substantially parallel" is a case where the difference between the slope angles is within the range of ±15°.

In FIG. 5A, a region 42 of the organic layer is not the organic layer extending along the slope portion 31 of the insulating layer. This is because the organic layer formed on the second region 21 has a large layer thickness, so that it conceals the organic layer formed so as to extend along the slope portion 31.

Figure 5B:
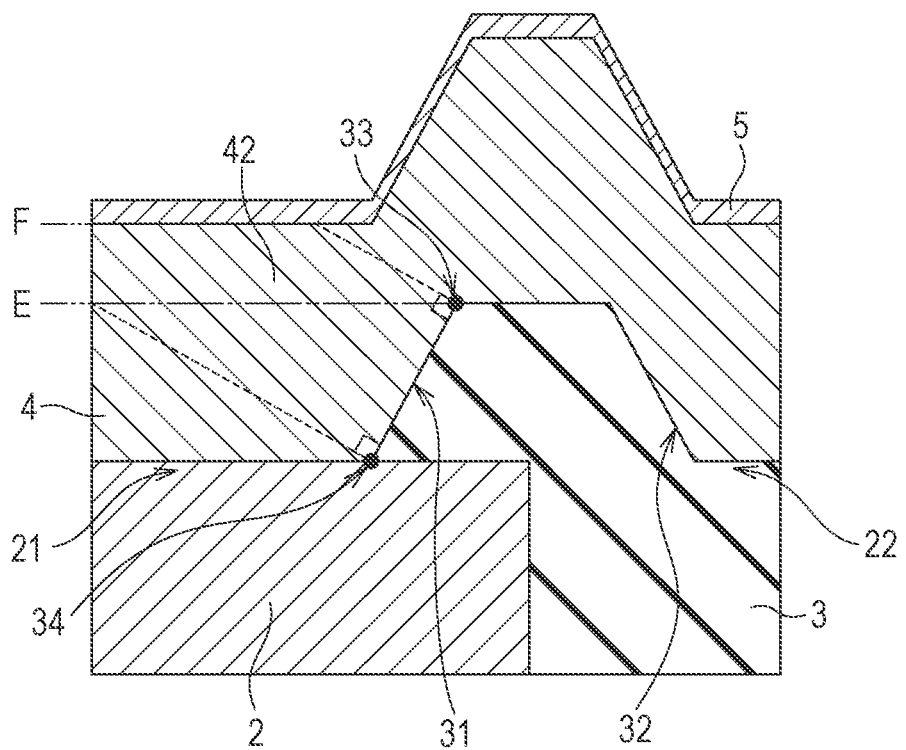
FIG. 5B is an enlarged view of a schematic sectional view illustrating the configuration of an organic light emitting device of a comparative example.

FIG. 5B illustrates a comparative example in which the organic layer 4 has the upper surface having height F larger than height E of an upper end 33 of the slope portion 31. In this case, the organic layer extending along the slope portion 31 is not present. This is because the organic layer formed on the second region 21 has a large layer thickness, so that it conceals the organic layer formed so as to extend along the slope portion 31. In the example in FIG. 5B, the organic layer has a relatively low resistance, so that leakage current flowing to neighboring light emitting elements may not be sufficiently reduced.

The inventors of the present disclosure studied organic devices having various configurations, and have found the following findings: referring to FIG. 5A, when the organic layer has, on the slope portion 31, a layer thickness G of 20 nm or more, leakage current between the upper electrode 5 and the lower electrode 2 can be considerably reduced. The layer thickness of the organic layer on the slope portion is a layer thickness measured in a direction perpendicular to the slope portion of the insulating layer. In addition, the organic layer extending along the slope portion has a smaller layer thickness than the organic layer formed on the flat portion, hence has a high electric resistance. The organic layer on the second region has a small layer thickness; in addition, the slope portion is formed to achieve an increase in the resistance of the organic layer. This results in a reduction in leakage current flowing to the neighboring light emitting element. When the leakage current flowing to the neighboring light emitting element is thus reduced, occurrence of unintentional emission from the light emitting element is reduced, to thereby reduce narrowing of the color gamut of the light emitting apparatus. The organic layer on the slope portion 31 preferably has a layer thickness G of 25 nm or more, particularly preferably 33 nm or more. This achieves a further reduction in the leakage current between the upper electrode and the lower electrode.

Thus, the organic device illustrated in FIG. 5A achieves both of a reduction in the leakage current flowing to neighboring light emitting elements, and a reduction in the leakage current between the upper electrode and the lower electrode. The layer thickness of the organic layer measured in a direction perpendicular to the slope portion may be 20 nm or more even in a portion having the smallest layer thickness on the single slope portion. The layer thickness of the organic layer measured in a direction perpendicular to the slope portion can be controlled by adjusting, for example, the slope angle of the slope portion or formation conditions of the organic layer. The slope portion of the insulating layer may have a slope angle of 50° or less.

The organic light emitting device according to this embodiment includes a plurality of insulating layers. One of such insulating layers is described above as an example. On each of the plurality of insulating layers, the organic layer on the slope portion may have a layer thickness of 20 nm or more measured in a direction perpendicular to the slope portion.

The layer thickness of the organic layer on the slope portion 31 of the insulating layer has been described so far. Similarly, on the slope portion 32 of the insulating layer, the layer thickness of the organic layer measured in a direction perpendicular to the slope portion can be 20 nm or more. On both of the slope portions, the organic layer can have a layer thickness of 20 nm or more. Of these slope portions, a case where, on the slope portion 31, the layer thickness is 20 nm or more is better than a case where, on the slope portion 32, the layer thickness is 20 nm or more. This is because, compared with the organic layer on the slope portion 32, the organic layer on the slope portion 31 contributes to the leakage current between the first electrode and the second electrode.

On a slope portion (on a first region of the first electrode) of each of a plurality of insulating layers, the layer thickness of the organic layer measured in a direction perpendicular to the slope portion may be 20 nm or more. On each slope portion of all the insulating layers, the layer thickness of the organic layer measured in a direction perpendicular to the slope portion may be 20 nm or more. On a slope portion (disposed between a first electrode and another first electrode) of a plurality of insulating layers, the layer thickness of the organic layer measured in a direction perpendicular to the slope portion may be 20 nm or more. On each slope portion (disposed between a first electrode and another first electrode) of all the insulating layers, the layer thickness of the organic layer measured in a direction perpendicular to the slope portion may be 20 nm or more.

In the organic light emitting device according to this embodiment, the slope surface of a slope portion is not parallel to the upper surface of the first electrode; the slope surface of the slope portion is, in the surface of the insulating layer, a region positioned between the upper surface of the insulating layer and the upper surface of the first electrode covered with the insulating layer. Stated another way, the slope surface of the slope portion is, in the surface of the insulating layer, a region positioned between the edge of the upper surface of the insulating layer, and the upper surface of the first electrode. The slope portion on the first electrode may have an angle of less than 90°. In the case where the angle is less than 90°, in the upward direction from the upper surface of the first electrode, the width of the opening defined by the insulating layer increases.

Second Example Embodiment

Figure 6:
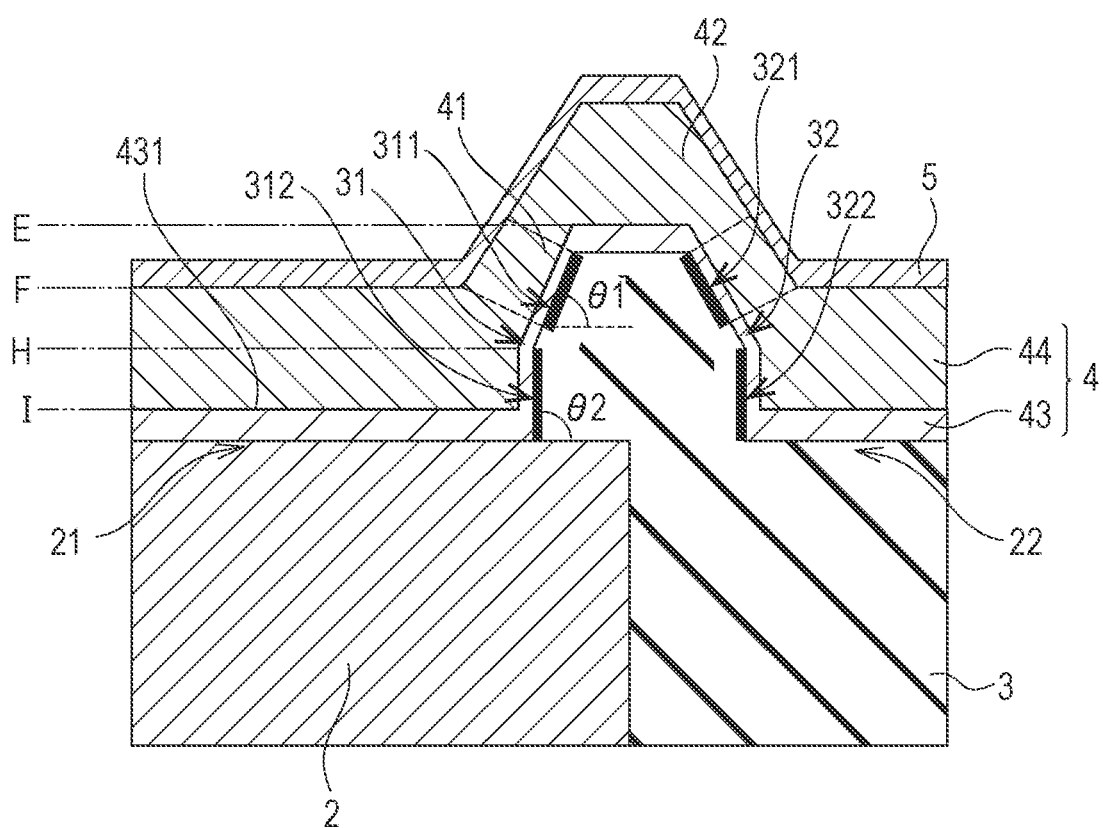
FIG. 6 is an enlarged view of a schematic sectional view illustrating the configuration of an organic light emitting device according to a second embodiment of the present disclosure.

FIG. 6 relates to a second embodiment according to the present disclosure. The second embodiment is the same as the first embodiment except that the insulating layer 3 has a different shape, and the organic layer includes, in a lower portion, a charge transport region. Hereinafter, the differences from the first embodiment and the resultant advantages will be described.

A slope portion 31 (on the first region of the first electrode) of the insulating layer includes a gentle slope portion (thick line portion) 311 and a steep slope portion (thick line portion) 312. The gentle slope portion is disposed, in the slope portion, between the upper end of the slope portion and the lower end of the slope portion. When the insulating layer has an upper surface, the height of the upper surface is equal to the height of the upper end; the upper surface itself is not included in the upper end. The steep slope portion is disposed between the gentle slope portion and the lower end of the slope portion. More specifically, the steep slope portion is disposed between the lower end of the gentle slope portion and the lower end of the slope portion.

In FIG. 6, the gentle slope portion 311 is, in the slope portion 31, a portion in contact with a region 41 of the organic layer extending along the slope portion. The gentle slope portion is formed at an angle θ1 relative to the upper surface of the first electrode. When the upper surface of the first electrode is parallel to the horizontal plane, the angle of the gentle slope portion may be θ1 relative to the horizontal plane. The steep slope portion is disposed between the gentle slope portion and the lower end of the insulating layer, and is formed at an angle θ2 relative to the upper surface of the first electrode. The steep slope portion 312 is, in the slope portion 31, a portion having the slope angle θ2 larger than the largest slope angle θ1 in the gentle slope portion 311.

The steep slope portion has a slope angle θ2 of more than 50°. The gentle slope portion has a slope angle θ1 of 50° or less. The steep slope portion can have a slope angle θ2 of more than 50° and 90° or less. The gentle slope portion can have a slope angle θ1 of 30° or more and 50° or less.

The organic layer 4 is constituted by a charge transport layer 43 and a region 44 including a light emitting layer; the charge transport layer is disposed on the first-electrode side of the organic layer 4. In the charge transport layer, the constituent component of the organic layer may be different from that of the organic layer. On the second region 21 of the first electrode, the charge transport layer has an upper surface 431 having height I smaller than height H of the upper end of the steep slope portion 312. Thus, the charge transport layer 43 forms a region having a small layer thickness in a direction perpendicular to the steep slope portion, which is a region extending along the steep slope portion 312.

In the case of forming the layer by vapor deposition, the larger the slope angle of the slope portion, the smaller the layer thickness of the resultant layer extending along the slope portion. This tends to result in an increase in the resistance of the charge transport layer. The charge transport layer is, in the organic layer, a region having a high charge transport capability, so that it tends to contribute to leakage current between light emitting elements. However, when the charge transport layer is formed with increased resistance as described above, leakage current between light emitting elements can be reduced.

Thus, on the second region 21 of the first electrode, the organic layer is formed so as to have an upper surface having height F larger than height H of the upper end of the steep slope portion 312. In this way, the organic layer 4 on the second region 21 has a region with increased resistance provided by formation of the steep slope portion.

Even when the insulating layer including the slope portion provides the thin region of the organic layer, in the organic light emitting device according to this embodiment, the organic layer on the slope portion has a layer thickness of 20 nm or more in a direction perpendicular to the slope portion. This achieves a reduction in the leakage current between the first electrode and the second electrode.

The gentle slope portion and the steep slope portion according to this embodiment can be formed in the following manner. For example, the gentle slope portion 311 can be formed by isotropic etching, and the steep slope portion 312 can be formed by anisotropic etching.

The case where the slope portion 31 of the insulating layer includes a gentle slope portion and a steep slope portion has been described so far as an example. A slope portion 32 of the insulating layer may include a gentle slope portion and a steep slope portion.

The steep slope portion and gentle slope portion of the insulating layer may each have a slope angle that is constant as illustrated in FIG. 6. Alternatively, the slope angle may vary along the slope portion. In this case, the boundary between the gentle slope portion and the steep slope portion is a point at which the slope angle exceeds 50°.

The charge transport layer according to this embodiment may be a hole transport layer. In general, a hole transport layer has a higher charge mobility than an electron transport layer. When such a hole transport layer is employed for this embodiment, a hole transport layer can be formed with increased resistance, to thereby provide a stronger effect of reducing the leakage current between light emitting elements. The hole transport layer may be a hole transport region constituted by a plurality of organic compound layers.

In the case of reducing the leakage current between light emitting elements, the light emitting layer can be of an electron trap type. The electron trap type means a light emitting layer in which, relative to the energy of the lowest unoccupied molecular orbital of the host material serving as the main component of the light emitting layer, the energy of the lowest unoccupied molecular orbital of a dopant material included in the light emitting layer is deep by 0.15 eV or more. This results in a decrease in the electron mobility of the light emitting layer. Thus, the leakage current between light emitting elements due to holes can be addressed by the increased resistance provided by the slope portion; the leakage current between light emitting elements due to electrons can be addressed by the increased resistance provided by the light emitting layer. This facilitates a reduction in both of leakage current between light emitting elements due to holes and leakage current between light emitting elements due to electrons.

Figure 7:
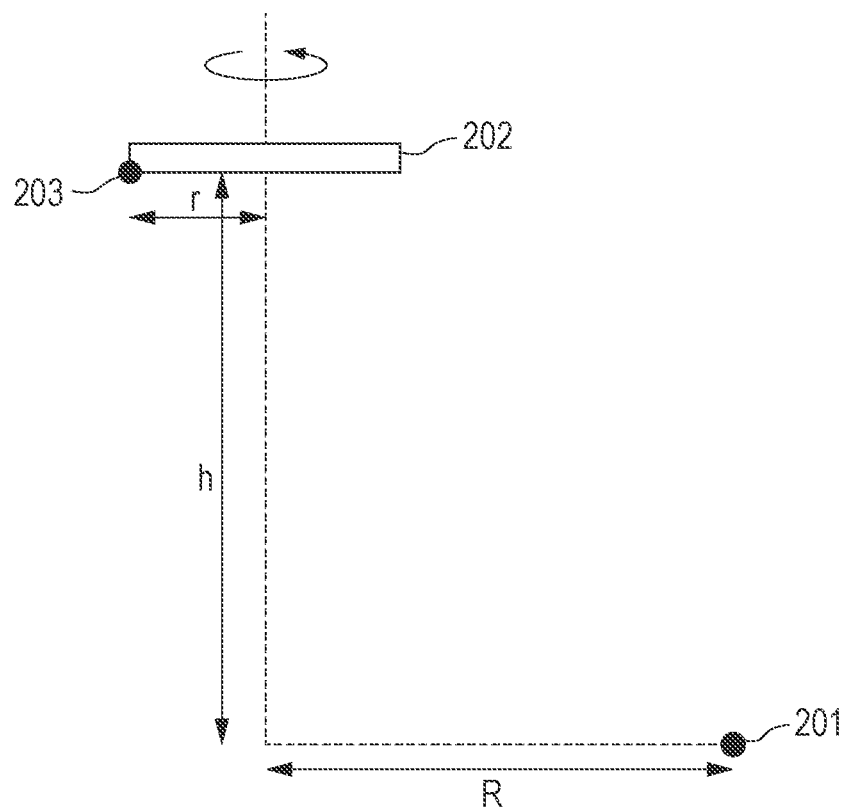
FIG. 7 illustrates members disposed in vapor deposition simulation.

In order to find desirable slope angles of the slope portion in this embodiment, simulation of film formation by vapor deposition was performed. FIG. 7 illustrates members disposed during the vapor deposition simulation. An evaporation source 201, a substrate 202, and an organic device 203 disposed on the substrate are positioned as illustrated in FIG. 7 such that R=200 mm, r=95 mm, and h=340 mm.

The simulation was performed with a vapor deposition distribution represented by the following Formula (9) where n=2.

$$\phi = \phi_0 \cos^n \alpha \qquad (9)$$

In this formula, $\alpha$ represents angle, $\phi$ represents vapor stream density at angle $\alpha$, and $\phi_0$ represents vapor stream density when $\alpha=0$. The substrate 202 was defined to be rotated at the center of the substrate.

At the position of the organic device 203 on the substrate, a slope portion having a slope angle of 0° to 90° was assumed to be disposed. While the layer thickness of the organic layer at a slope angle of 0° was set to 76 nm, the layer thicknesses of regions of the organic layers extending along the slope portions at different slope angles were calculated.

Figure 8:
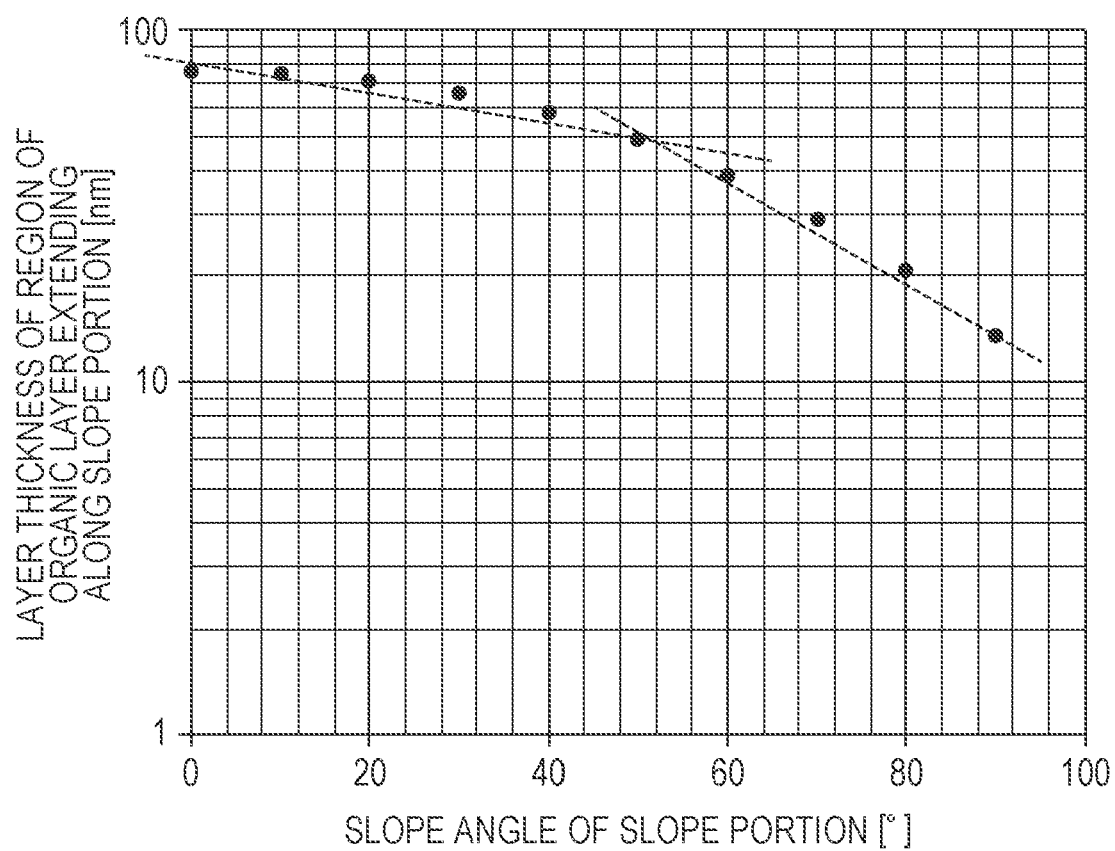
FIG. 8 is a graph of the results of the vapor deposition simulation.

FIG. 8 illustrates the results of the simulation of film formation. This has demonstrated the following: when the slope angle is more than 50°, the region of the organic layer extending along the slope portion tends to have a small layer thickness; when the slope angle is 50° or less, the region of the organic layer extending along the slope portion tends to have a large layer thickness. Thus, in this embodiment, the steep slope portion can be formed to have a slope angle of more than 50°, and the gentle slope portion can be formed to have a slope angle of 50° or less.

In this embodiment, the steep slope portion may include a portion having a slope angle of more than 90°. In this case, in particular, the charge transport layer on the steep slope portion tends to have a small layer thickness, which tends to result in a reduction in the leakage current between light emitting elements.

Applications of Organic Light Emitting Device According to This Embodiment

The organic light emitting device according to this embodiment can be used as a constituent member for a display apparatus or an illumination apparatus, and is also applicable to the exposure light source of an electrophotographic image-forming apparatus, the backlight of a liquid crystal display apparatus, or a light emitting apparatus in which a white light source is equipped with a color filter.

The display apparatus may be an image information processing apparatus including an image input section configured to input image information from, for example, an area CCD, a linear CCD, or a memory card, and an information processing section configured to process the inputted information, and configured to display the inputted image on a display unit.

An image pickup apparatus or an ink jet printer may have a display unit having a touch panel function. The operation type of this touch panel function is not particularly limited, and may be an infrared type, a capacitance type, a resistive film type, or an electromagnetic induction type. The display apparatus may be used as a display unit of a multifunctional printer.

Hereinafter, a display apparatus according to an embodiment will be described. The display apparatus may include an organic light emitting device and a transistor connected to the organic light emitting device. The transistor is an example of an active device.

The transistor may be connected, via a contact hole formed in the interlayer insulating layer, to the first electrode constituting the organic light emitting device.

Incidentally, the configuration of electric connections of electrodes (anode and cathode) included in the organic light emitting device and electrodes (source electrode and drain electrode) included in the transistor is not particularly limited. In other words, any configuration may be employed as long as one of the anode and the cathode is electrically connected to one of the source electrode and the drain electrode of the transistor.

In the display apparatus, the transistors are not limited to transistors using a single-crystal silicon wafer, and may be thin-film transistors having an active layer on the insulating surface of the substrate. The active layer may be formed of single-crystal silicon, a non-single-crystal silicon such as amorphous silicon or microcrystal silicon, or a non-single-crystal oxide semiconductor such as indium zinc oxide or indium gallium zinc oxide. Incidentally, thin-film transistors are also referred to as TFT.

The transistors included in the display apparatus may be formed within the substrate such as a Si substrate. The phrase "formed within the substrate" means that the substrate itself such as a Si substrate is processed to form transistors. In other words, the configuration in which transistors are included within the substrate can be regarded as a configuration in which the substrate and the transistors are formed as a single unit.

The organic light emitting device according to this embodiment is controlled, in terms of emission luminance, by TFTs as examples of switching devices. A plurality of such organic light emitting devices are arranged in a plane, to emit light at individual emission luminances to thereby display images. Incidentally, whether transistors are formed within the substrate or TFTs are formed depends on the size of the display unit. For example, when the display unit has a size of about 0.5 inches, the organic light emitting device can be formed on a Si substrate.

Figure 9:
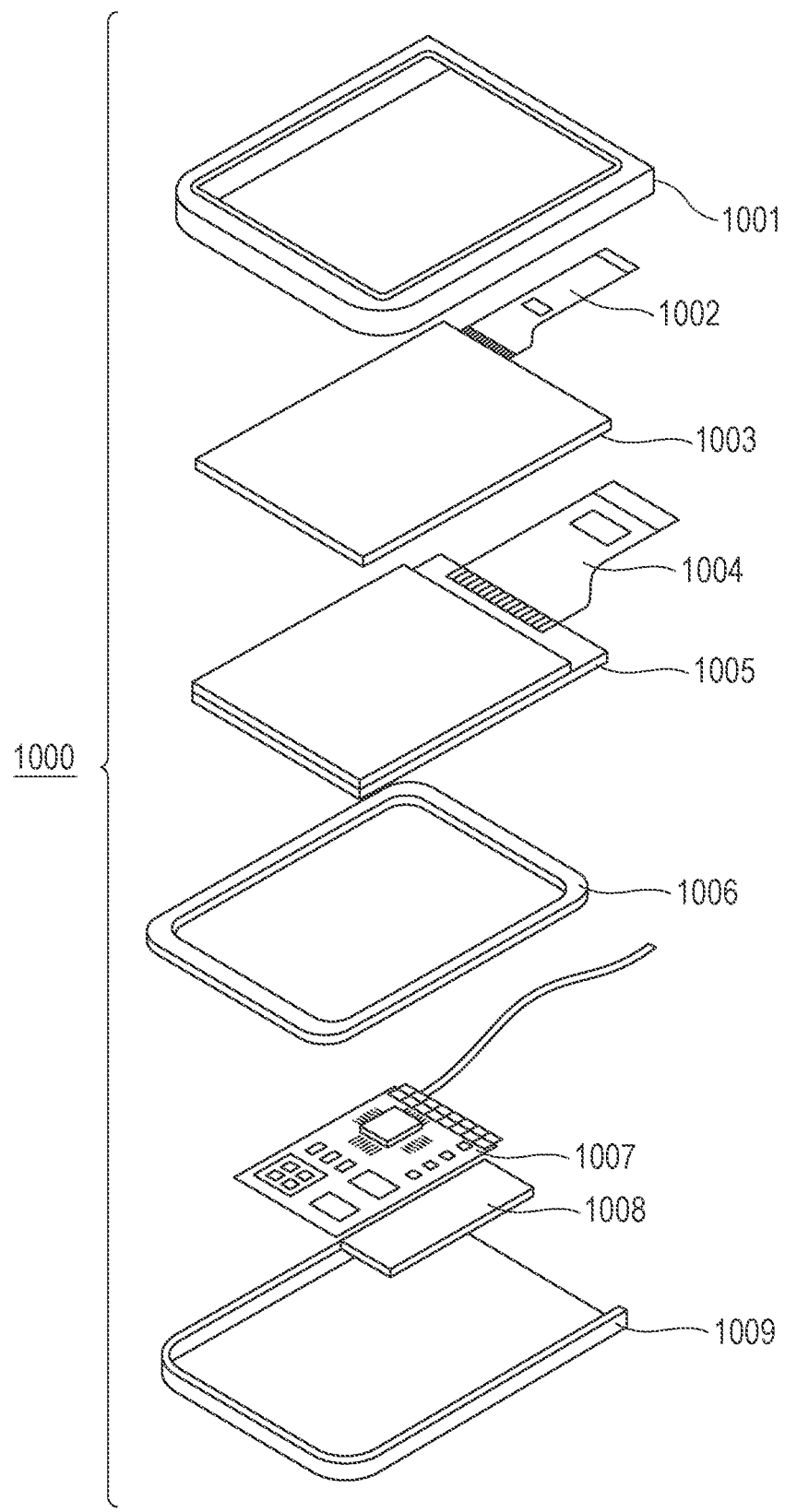
FIG. 9 is a schematic view of an example of a display apparatus according to an embodiment.

FIG. 9 is a schematic view illustrating an example of a display apparatus according to an embodiment. A display apparatus 1000 may include, between an upper cover 1001 and a lower cover 1009, a touch panel 1003, a display panel 1005, a frame 1006, a circuit substrate 1007, and a battery 1008. To the touch panel 1003 and the display panel 1005, flexible printed circuit FPCs 1002 and 1004 are respectively connected. On the circuit substrate 1007, transistors are formed by printing. The battery 1008 may not be installed when the display apparatus is not a mobile apparatus. When the display apparatus is a mobile apparatus, the battery 1008 may be installed in another position.

A display apparatus according to this embodiment may be used as a display unit of an image pickup apparatus including an optical unit including a plurality of lenses and an image pickup device configured to receive light having passed the optical unit. The image pickup apparatus may include a display unit configured to display information obtained by the image pickup device. The display unit may be a display unit exposed outside of the image pickup apparatus, or a display unit disposed within the finder. The image pickup apparatus may be a digital camera or a digital video camera.

Figure 10A:
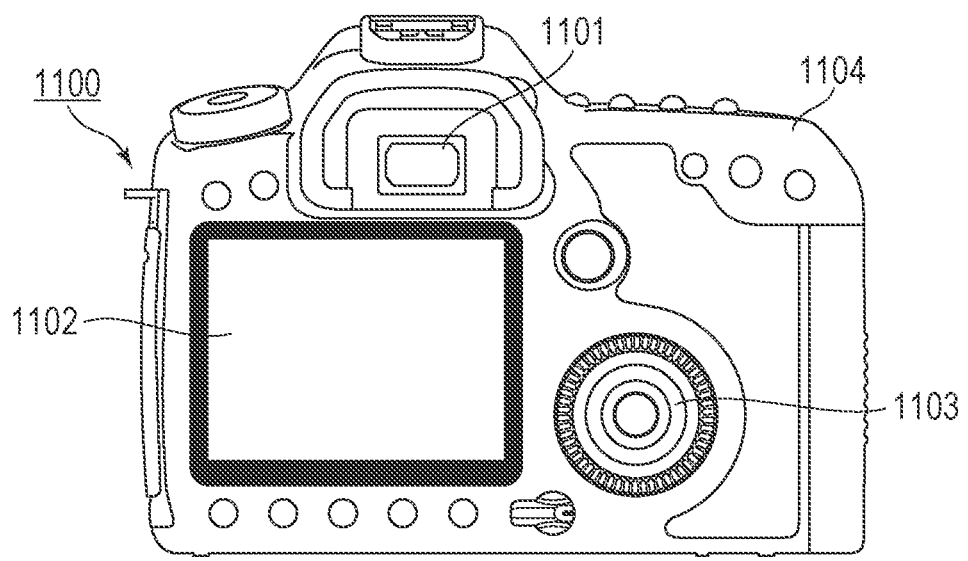
FIG. 10A is a schematic view of an example of an image pickup apparatus according to an embodiment.

FIG. 10A is a schematic view illustrating an example of an image pickup apparatus according to an embodiment. An image pickup apparatus 1100 may include a view finder 1101, a rear surface display 1102, an operation unit 1103, and a housing 1104. The view finder 1101 may include the display apparatus according to this embodiment. In this case, the display apparatus may display not only an image to be captured, but also, for example, environmental information and image capture instructions. Examples of the environmental information include the intensity of external light, the orientation of external light, the moving speed of the subject, and the probability that the subject may hide behind an obstacle.

Since the timing suitable for capturing an image lasts for a very short period, the information is desirably displayed with minimum delay. Thus, a display apparatus employing an organic light emitting device according to an embodiment of the present disclosure can be used because the organic light emitting device responds at a high speed. The display apparatus employing the organic light emitting device can be more suitably used for such image pickup apparatuses required to display images at high speed than liquid crystal display apparatuses.

The image pickup apparatus 1100 includes an optical unit (not shown). The optical unit includes a plurality of lenses and is configured to form an image in the image pickup device contained within the housing 1104. The plurality of lenses can be adjusted in terms of relative positions, to thereby adjust the focus. This operation can also be performed automatically.

The display apparatus according to this embodiment may include red, green, and blue color filters. These red, green, and blue color filters may be arranged in a delta array.

The display apparatus according to this embodiment may be used for a display unit of a portable terminal. In this case, the display apparatus may have both of a display function and an operation function. Examples of the portable terminal include cellular phones such as smartphones, tablets, and head mount displays.

Figure 10B:
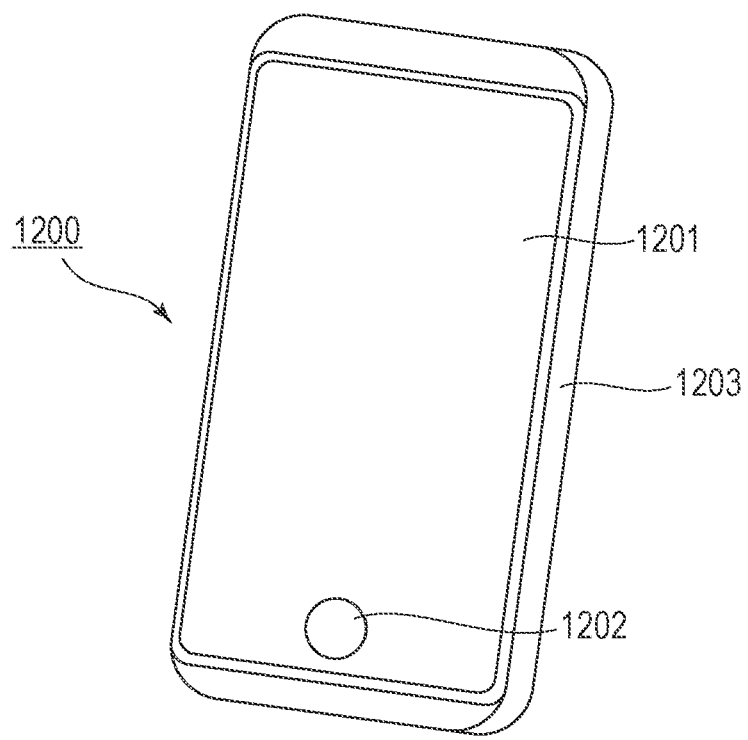
FIG. 10B is a schematic view of an example of an electronic apparatus according to an embodiment.

FIG. 10B is a schematic view illustrating an example of an electronic apparatus according to an embodiment. An electronic apparatus 1200 includes a display unit 1201, an operation unit 1202, and a housing 1203. The housing 1203 may include circuits, a printed substrate including the circuits, a battery, and a communication unit. The operation unit 1202 may be a button or a touch-panel-type sensor unit. The operation unit may be a biometric unit configured to scan a fingerprint for unlocking, for example. Such an electronic apparatus including a communication unit can also be referred to as a communication apparatus.

Figure 11A:
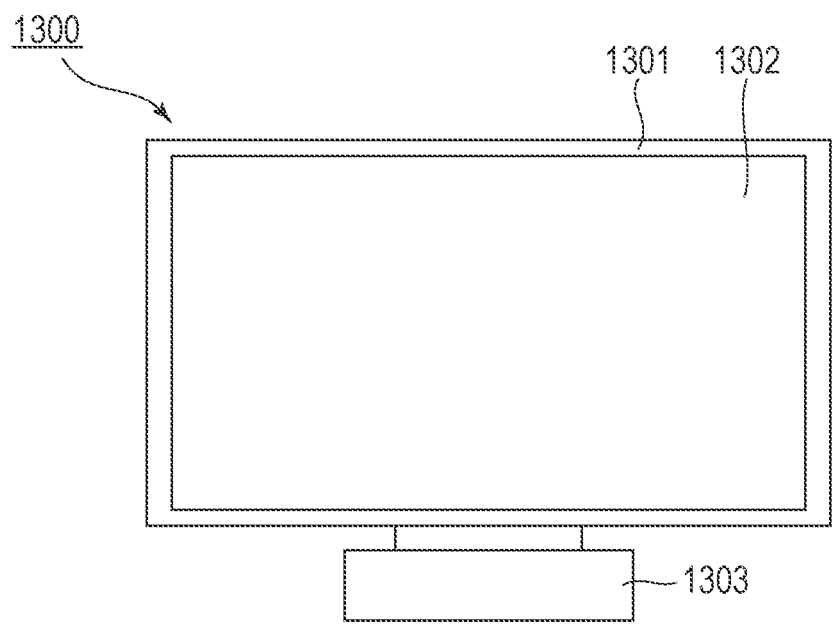
FIG. 11A is a schematic view of an example of a display apparatus according to an embodiment.
Figure 11B:
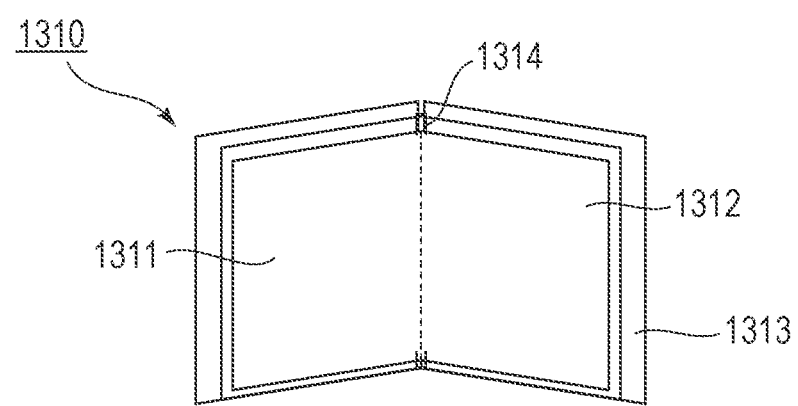
FIG. 11B is a schematic view of an example of a foldable display apparatus.

FIGS. 11A and 11B are schematic views illustrating examples of a display apparatus according to an embodiment. FIG. 11A illustrates a display apparatus such as a television monitor or a PC monitor. A display apparatus 1300 includes a frame 1301 and a display unit 1302. The display unit 1302 may employ the light emitting device according to the embodiment.

The display apparatus includes a base 1303, which supports the frame 1301 and the display unit 1302. The base 1303 is not limited to the form illustrated in FIG. 11A. The lower side of the frame 1301 may also function as the base.

The frame 1301 and the display unit 1302 may be curved. The radius of the curvature may be 5000 mm or more and 6000 mm or less.

FIG. 11B is a schematic view illustrating another example of the display apparatus according to this embodiment. A display apparatus 1310 in FIG. 11B can be folded, namely a foldable display apparatus. The display apparatus 1310 includes a first display unit 1311, a second display unit 1312, a housing 1313, and a folding point 1314. The first display unit 1311 and the second display unit 1312 may include the light emitting device according to the embodiment. The first display unit 1311 and the second display unit 1312 may be collectively designed as a seamless single display apparatus. The first display unit 1311 and the second display unit 1312 can be sectioned with respect to the folding point. Specifically, the first display unit 1311 and the second display unit 1312 may individually display different images; and the first and second display units may collectively display a single image.

Figure 12A:
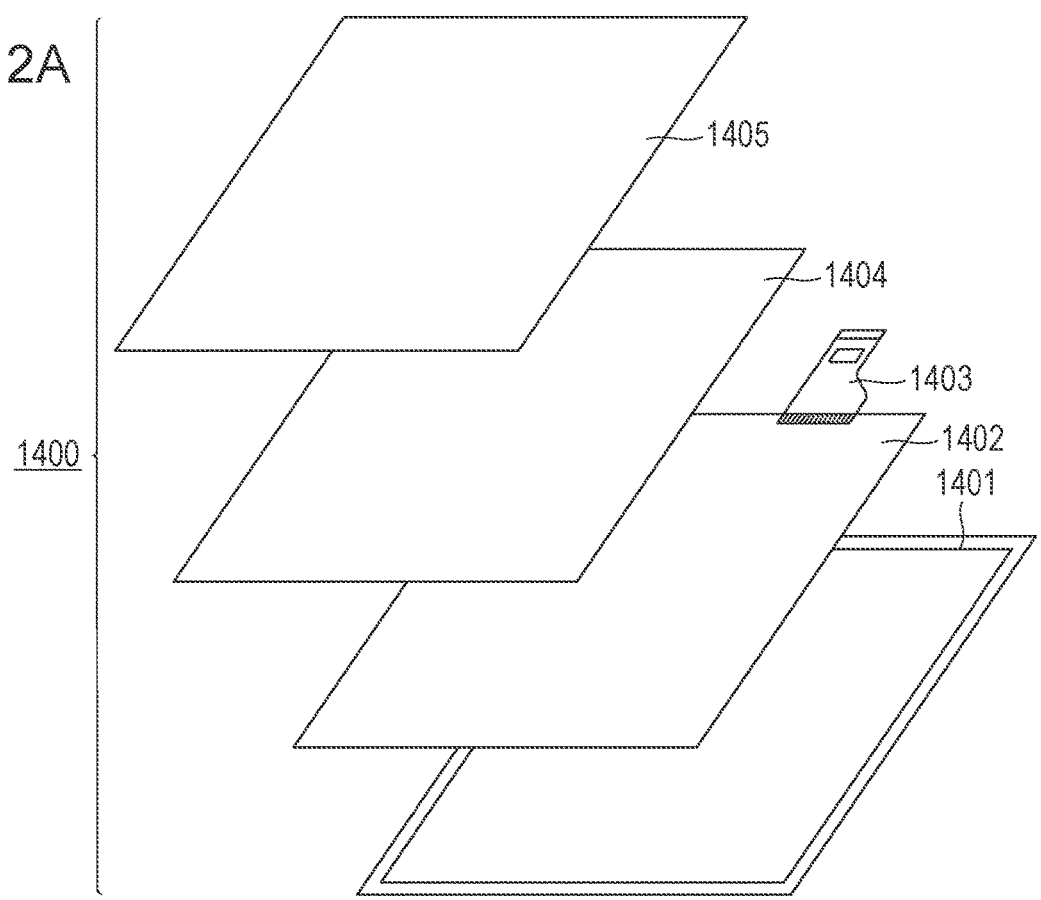
FIG. 12A is a schematic view of an example of an illumination apparatus according to an embodiment.

FIG. 12A is a schematic view illustrating an example of an illumination apparatus according to an embodiment. An illumination apparatus 1400 may include a housing 1401, a light source 1402, a circuit substrate 1403, an optical film 1404, and a light diffusion unit 1405. The light source may include the organic light emitting device according to the embodiment. An optical filter may be provided to improve color rendering of the light source. The light diffusion unit is configured to effectively diffuse light from the light source to deliver the light to a wide area, to achieve lighting up, for example. The optical filter and the light diffusion unit may be provided on the light exit side of the illumination. The illumination may be optionally equipped with a cover for the outermost portion thereof.

The illumination apparatus is, for example, an apparatus configured to illuminate the inside of a room. The illumination apparatus may be configured to emit light of any color of white, neutral white, and colors from blue to red. The illumination apparatus may include a light modulation circuit for modulating the light. The illumination apparatus may include an organic light emitting device according to an embodiment of the present disclosure and a power supply circuit connected to the organic light emitting device. The power supply circuit is configured to convert alternating current voltage to direct current voltage. The "white" corresponds to a color temperature of 4200 K. The "neutral white" corresponds to a color temperature of 5000 K. The illumination apparatus may include a color filter.

The illumination apparatus according to this embodiment may include a heat dissipation unit. The heat dissipation unit is configured to release heat inside of the apparatus to the outside of the apparatus. The heat dissipation unit is formed of, for example, a metal having a high specific heat or liquid silicone.

Figure 12B:
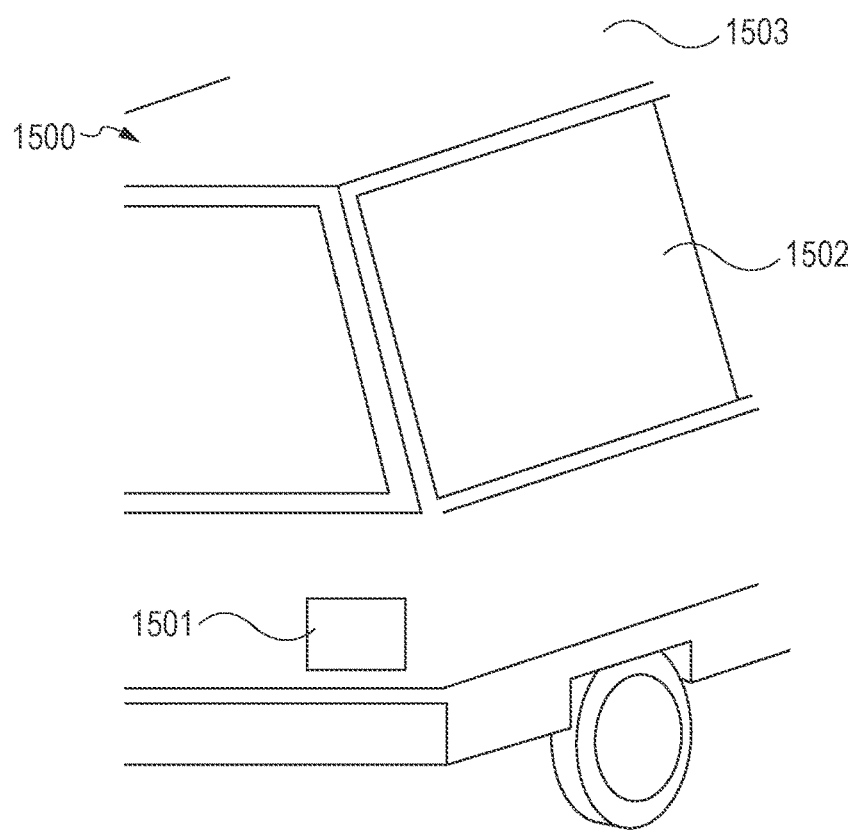
FIG. 12B is a schematic view of an example of an automobile including a vehicle illumination unit according to an embodiment.

FIG. 12B is a schematic view of an automobile serving as an example of a moving object according to an embodiment. The automobile includes a tail lamp serving as an example of the illumination unit. An automobile 1500 includes a tail lamp 1501 that may be configured to turn on upon braking, for example.

The tail lamp 1501 may include the organic light emitting device according to the embodiment. The tail lamp may include a protective member for protecting the organic EL device. The material forming the protective member is not limited as long as it has relatively high strength and is transparent. The protective member can be formed of polycarbonate, for example. The polycarbonate may be mixed with, for example, a furandicarboxylic acid derivative or an acrylonitrile derivative.

The automobile 1500 may include an automobile body 1503 and a window 1502 attached to the automobile body 1503. When the window is not windows for checking ahead or behind of the automobile, it may be designed as a transparent display. This transparent display may include the organic light emitting device according to the embodiment. In this case, constituent members of the organic light emitting device, such as electrodes, are provided as transparent members.

The moving object according to this embodiment may be a ship, an aircraft, or a drone, for example. The moving object may include a body and an illumination unit provided to the body. The illumination unit may emit light in order to indicate the position of the body. The illumination unit includes the organic light emitting device according to the embodiment.

As has been described so far, apparatuses employing the organic light emitting device according to the embodiment enable displaying of images with high quality for a long time with stability.

EXAMPLES

Example 1

Hereinafter, an example of the organic light emitting device 100 according to this embodiment will be described. On the substrate 1, a metal layer is formed. Desired regions of the metal layer were etched off using, for example, a mask pattern, to thereby form the lower electrodes 2. Subsequently, the insulating layers 3 were formed so as to cover the edges of the lower electrodes 2. In this Example, the insulating layers 3 were formed of silicon oxide; each insulating layer 3 was formed with a thickness of 80 nm measured on the upper surface of such a lower electrode 2 in a direction perpendicular to the upper surface of the substrate 1. After the insulating layers 3 were formed, desired regions of the insulating layers 3 were etched off using, for example, a mask pattern, to thereby form openings 12. As illustrated in FIG. 6, each insulating layer 3 was formed so as to have a gentle slope portion and a steep slope portion. The gentle slope portion 311 had a slope angle of 40°, and the steep slope portion 312 had a slope angle of 80°. The height of the upper end of the steep slope portion 312 was set to 50 nm relative to the second region (flat portion) 21 at the upper surface of the first electrode. The height of the slope portion 31 was set to 80 nm relative to the second region (flat portion) 21 of the first electrode. In the slope portion 32 of the insulating layer 3, the gentle slope portion 321 was formed so as to have a slope angle of 40°, and the steep slope portion 322 was formed so as to have a slope angle of 80°. The height of the slope portion 32 was set to 80 nm relative to the flat portion 22 between the first electrode and another first electrode. In this Example, pixels were arranged in a delta array in which adjacent openings 12 had a distance of 1.4 μm therebetween, and adjacent lower electrodes 2 had a distance of 0.6 μm therebetween. As illustrated in FIG. 2, the pixels each having a hexagonal shape were arranged in the delta array.

Subsequently, the organic layer 4 was formed. The organic layer was formed so as to include, in the following order, a hole injection layer, a hole transport layer, an electron blocking layer, a light emitting layer having a double layer structure, an electron transport layer, and an electron injection layer. On the substrate 1, the hole injection layer was first formed using a material represented by the following Compound 1 to a thickness of 7 nm.

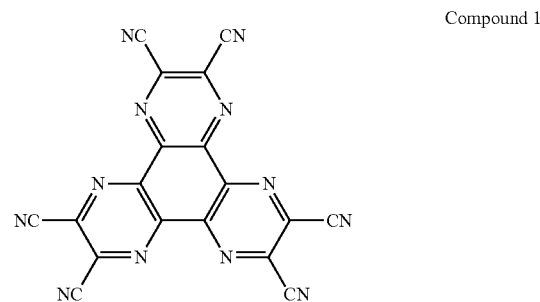 [SMILES: N#Cc1nc2c3nc(C#N)c(C#N)nc3c3nc(C#N)c(C#N)nc3c2nc1C#N]

Compound 1

Subsequently, the hole transport layer was formed using a material represented by the following Compound 2 to a thickness of 5 nm, and the electron blocking layer was formed using a material represented by the following Compound 3 to a thickness of 10 nm. The light emitting layer was formed so as to have a stack structure of two layers. As a first light emitting layer, a light emitting layer was formed so as to include a host material represented by the following Compound 4, and an emission dopant represented by the following Compound 5. The amount of the emission dopant was adjusted so as to satisfy a weight ratio of 3%. The first light emitting layer was formed with a layer thickness of 10 nm.

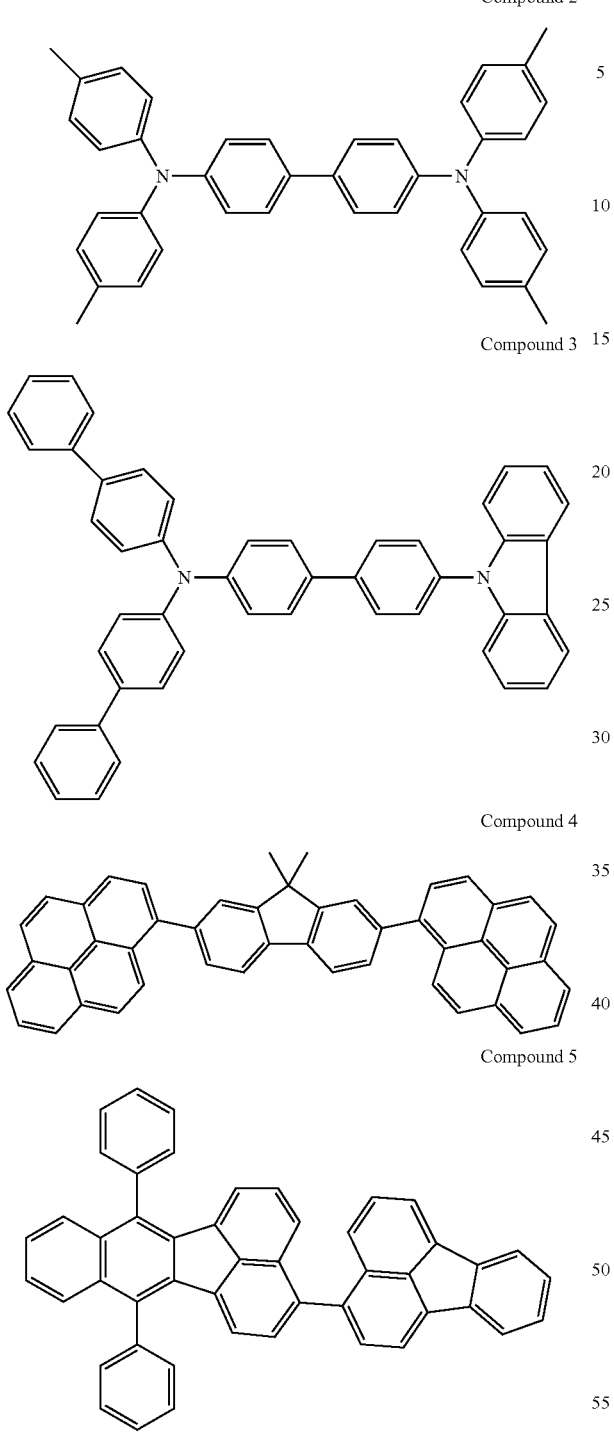

Subsequently, as a second light emitting layer, a light emitting layer was formed so as to include a host material represented by Compound 4 above, and an emission dopant represented by the following Compound 6. The amount of the emission dopant was adjusted so as to satisfy a weight ratio of 1%. The second light emitting layer was formed with a layer thickness of 10 nm. After the light emitting layer having a double layer structure was formed, the electron transport layer was formed using the following Compound 7 to a thickness of 34 nm. Furthermore, the electron injection layer was formed using LiF to a thickness of 0.5 nm.

After the organic layer 4 was formed, the upper electrode 5 was formed using a MgAg alloy having a Mg—Ag ratio of 1:1 to a thickness of 10 nm. After the upper electrode 5 was formed, a sealing layer 6 was formed using SiN by CVD to a thickness of 1.5 μm. After this protective layer 6 was formed, the color filters 7 were formed.

The ratio of the distance (1.4 μm) between openings of two adjacent first electrodes to the layer thickness (76 nm, total thickness of the organic sublayers) of the organic layer on the first electrodes was 18, which was less than 50. On the second region (flat portion) 21 of such a first electrode, the organic layer had a layer thickness of 76 nm, which was smaller than the height (80 nm) of the upper end of the slope portion 31. On the flat portion 22, the organic layer had a layer thickness of 76 nm, which was smaller than the height (80 nm) of the upper end of the slope portion 32. The region 41 of the organic layer extending along the slope portion 31, and the region 42 of the organic layer extending along the slope portion 32 had organic layer thicknesses of 36 nm to 45 nm, which were 20 nm or more. Among the peaks in the emission spectrum of the light emitting layer, a peak at the shortest wavelength λ was found at 460 nm; the optical distance L was found to be 146 nm; and the phase shift φ was found to be −π. Thus, the following Formula (5) was satisfied.

$$(\lambda/8)\times(-(2\phi/\pi)-1) < L < (\lambda/8)\times(-(2\phi/\pi)+1) \qquad (5)$$

The organic layer includes, between the first electrode and the light emitting layer, a hole transport region constituted by the hole injection layer and the hole transport layer. The charge transport region on the flat portion 21 has an upper surface having a height (relative to the flat portion 21) of 12 nm, which is smaller than the height (50 nm) of the upper end of the steep slope portion. The organic layer on the flat portion 21 has an upper surface having a height (relative to the flat portion 21) of 76 nm, which is larger than the height (50 nm) of the upper end of the steep slope portion 312. Similarly, the charge transport region on the flat portion 22 has an upper surface having a height (relative to the flat portion 22) of 12 nm, which is smaller than the height (50 nm) of the upper end of the steep slope portion. The organic layer on the flat portion 22 has an upper surface having a height (relative to the flat portion 22) of 76 nm, which is larger than the height (50 nm) of the upper end of the steep slope portion 322.

Hereinafter, characteristics of the organic light emitting device 100 formed in Example 1 will be described. First, regarding an index of leakage current between light emitting elements, $I_{leak}/I_{oled}$, a method of measuring this index will be described with reference to an R pixel as an example. Current is passed through the R pixel while G pixels and B pixels adjacent to the R pixel are short-circuited (potential=0 V). In this case, the current passing from the first electrode of the R pixel to the second electrode of the R pixel was denoted by $I_{oled}$; the sum of current passing from the first electrode of the R pixel to the second electrodes of G pixels or B pixels was denoted by $I_{leak}$. $I_{leak}$ was measured at a potential providing an $I_{oled}$ of 0.1 nA/pixel. The ratio of $I_{leak}$ to $I_{oled}$ is expressed by $I_{leak}/I_{oled}$. Cases where the $I_{leak}/I_{oled}$ was 0.20 or less were evaluated as achieving a reduction in the leakage current.

Second, the leakage current between the upper electrode and the lower electrode will be described. Organic light emitting elements have an emission threshold voltage of about 2 V. Thus, in a light emitting element in which leakage current does not flow between the upper electrode and the lower electrode, when a voltage such as 1.5 V is applied between the upper electrode and the lower electrode, current does not flow. By contrast, in a light emitting element in which leakage current flows between the upper electrode and the lower electrode, when the voltage of 1.5 V is applied between the upper electrode and the lower electrode, current flows. Thus, a current value was measured while the voltage of 1.5 V was applied between the upper electrode and the lower electrode of the R pixel. Specifically, the current flowing upon application of 1.5 V is leakage current. In a light emitting element in which a reduction in the leakage current between the upper electrode and the lower electrode is achieved, current does not flow upon application of 1.5 V.

Subsequently, while a voltage of 5 V was applied between the upper electrode and the lower electrode of the R pixel, a current value and a luminance were measured.

As a result, $I_{leak}/I_{oled}$ was found to be 0.15; the amount of current upon application of a voltage of 1.5 V was found to be $1\times10^{-6}$ nA/pixel; the amount of current upon application of a voltage of 5 V was found to be 16 nA/pixel; the luminance was found to be 250 cd/m². Thus, device characteristics including the high luminance were obtained.

Comparative Example 1

An organic light emitting device was produced as in Example 1 except that the height of the steep slope portion 312 relative to the flat portion 21 was set to 90 nm, the height of the slope portion 31 relative to the flat portion 21 was set to 120 nm, the height of the steep slope portion 322 relative to the flat portion 22 was set to 90 nm, and the height of the slope portion 32 relative to the flat portion 22 was set to 120 nm. The region 41 of the organic layer extending along the slope portion 31 was formed so as to extend along, in addition to the gentle slope portion 311, the steep slope portion 312. The organic layer extending along the steep slope portion was found to have thicknesses of 18 to 24 nm. The same applied to the slope portion 32.

As a result, an excessively large leakage current flowed between the upper electrode and the lower electrode, so that $I_{leak}/I_{oled}$ was not accurately measured. Specifically, $I_{leak}$ was large and $I_{oled}$ was small, so that the resultant $I_{leak}/I_{oled}$ was a very large value and hence unmeasurable. The amount of current upon application of a voltage of 1.5 V was found to be $1\times10^{-1}$ nA/pixel, which was very large. At the inner periphery of the opening, a phenomenon of a decrease in the intensity of emission occurred. This was inferentially caused because the leakage current between the upper electrode and the lower electrode results in a region subjected to a decrease in the potential difference between the upper electrode and the lower electrode.

This has demonstrated the following: when a region of the organic layer extending along the slope portion has a portion having a layer thickness of less than 20 nm, a large leakage current flows between the upper electrode and the lower electrode.

Comparative Example 2

An organic device was produced as in Example 1 except that the height of the steep slope portion 312 relative to the flat portion 21 was set to 30 nm and the height of the slope portion 31 relative to the flat portion 21 was set to 50 nm, and the height of the steep slope portion 322 relative to the flat portion 22 was set to 30 nm and the height of the slope portion 32 relative to the flat portion 22 was set to 50 nm.

As a result, $I_{leak}/I_{oled}$ was found to be 0.25, and the amount of current upon application of a voltage of 1.5 V was found below the limit of measurement ($10^{-6}$ nA/pixel). As is clear from the $I_{leak}/I_{oled}$ of 0.25, the proportion of the leakage current was high, and a very large leakage current flowed between light emitting elements.

This has demonstrated the following: when the organic layer on such a flat portion has an upper surface having a height larger than the height of the upper end of the slope portion, crosstalk between light emitting elements tends to be significant.

Comparative Example 3

An organic light emitting device was produced as in Example 1 except that the electron transport layer was formed so as to have a layer thickness of 140 nm.

As a result, $I_{leak}/I_{oled}$ was found to be 0.35, and the amount of current upon application of a voltage of 1.5 V was found below the limit of measurement ($10^{-6}$ nA/pixel). As is clear from the $I_{leak}/I_{oled}$ of 0.35, the proportion of the leakage current was high, and a very large leakage current flowed between light emitting elements. This has demonstrated the following: when the organic layer on the flat portion has an upper surface having a height larger than the height of the upper end of the slope portion, crosstalk between light emitting elements tends to be significant.

Since the electron transport layer was formed with a layer thickness of 140 nm, the resultant organic layer on the lower electrode had a total thickness of 182 nm, which was larger than in Example 1. As a result, the following Formula (5) was not satisfied, so that the λ/4 interference condition was not satisfied.

$$(\lambda/8)\times(-(2\phi/\pi)-1) < L < (\lambda/8)\times(-(2\phi/\pi)+1) \quad (5)$$

As a result, the amount of current upon application of a voltage of 5 V was found to be 6 nA/pixel, and the luminance was found to be 90 cd/m$^2$; thus, the amount of current and the luminance were small. This was inferentially caused because the organic layer on the lower electrode was formed with the increased thickness, which resulted in an increase in the resistance.

Comparative Example 4

An organic light emitting device was produced as in Comparative Example 1 except that, relative to the flat portion 21, the angle of the steep slope portion 312 was set to 76°, and the angle of the steep slope portion 322 was set to 76°. Among the layer thicknesses of the organic layer extending along the slope portion 31 and the slope portion 32 measured in a direction perpendicular to such a slope portion, the layer thickness of the thinnest portion (hereafter, organic layer minimum thickness) was found to be 19 nm. The amount of current upon application of a voltage of 1.5 V was found to be $3\times10^{-4}$ nA/pixel.

Example 2

An organic light emitting device was produced as in Example 1 except that, relative to the flat portion 21, the height of the steep slope portion 312 was set to 70 nm, and the height of the steep slope portion 322 was set to 70 nm. The organic layer minimum thickness was found to be 20 nm. The amount of current upon application of a voltage of 1.5 V was found to be $3\times10^{-5}$ nA/pixel.

Example 3

An organic light emitting device was produced as in Example 1 except that, relative to the flat portion 21, the height of the steep slope portion 312 was set to 65 nm, and the height of the steep slope portion 322 was set to 65 nm. The organic layer minimum thickness was found to be 25 nm. The amount of current upon application of a voltage of 1.5 V was found to be $7\times10^{-6}$ nA/pixel.

Example 4

An organic light emitting device was produced as in Example 1 except that, relative to the flat portion 21, the height of the steep slope portion 312 was set to 58 nm, and the height of the steep slope portion 322 was set to 58 nm. The organic layer minimum thickness was found to be 29 nm. The amount of current upon application of a voltage of 1.5 V was found to be $4\times10^{-6}$ nA/pixel.

FIG. 13 illustrates the relation of the leakage current between the upper electrode and the lower electrode against, among the layer thicknesses of the organic layer on the slope portions measured in a direction perpendicular to such a slope portion, the layer thickness of the thinnest portion. Specifically, FIG. 13 illustrates, in organic light emitting devices of Comparative Examples 1 and 4 and Examples 1, 2, 3, and 4, the relation of the leakage current between the upper electrode and the lower electrode against, among the layer thicknesses of the organic layer extending along the slope portion 31 and the slope portion 32 measured in a direction perpendicular to such a slope portion, the layer thickness of the thinnest portion (organic layer minimum thickness).

FIG. 13 has demonstrated the following. When the region of the organic layer extending along the slope portions includes a portion having a layer thickness of less than 20 nm, a large leakage current flows between the upper electrode and the lower electrode. By contrast, when the region of the organic layer extending along the slope portions has a layer thickness of 20 nm or more, the leakage current between the upper electrode and the lower electrode is less than $1\times10^{-4}$ nA/pixel, so that good characteristics are maintained. When the region of the organic layer extending along the slope portions has a layer thickness of 25 nm or more, the leakage current between the upper electrode and the lower electrode is less than $1\times10^{-5}$ nA/pixel, which provides even better characteristics.

Comparative Example 4

An organic light emitting device was produced as in Example 1 except that the insulating layer was formed so as to have the structure illustrated in FIG. 5A, the slope angle of the slope portion 31 was set to 67°, and the slope angle of the slope portion 32 was set to 40°. The pixels each have a hexagonal shape. Thus, the slope portion 31 is constituted by regions that correspond to the sides of the hexagon, and that are numbered 1 to 6 counterclockwise from the side on the right in FIG. 2.

In the organic light emitting device of this Comparative Example, a current of 1 nA/pixel was applied to 25 pixels. This resulted in the occurrence of a phenomenon of a decrease in the emission intensity at the inner periphery of each opening. This phenomenon of a decrease in the emission intensity at the inner periphery of the opening occurred differently depending on the sides of the hexagon. This has been found to be associated with the layer thickness of the region of the organic layer extending along the slope portion. The results are described in Table 1.

Table 1 has demonstrated the following. When the layer thickness of the region of the organic layer extending along the slope portion is 33 nm or more, the phenomenon of a decrease in the emission intensity at the inner periphery of the opening does not occur, which means that a reduction is achieved in the leakage current between the upper electrode and the lower electrode.

TABLE 1

| Sides of hexagon | Layer thickness of organic layer on slope portion | Percentage of occurrence of phenomenon of darkening in peripheral region of opening |
| --- | --- | --- |
| No. 1 | 27 nm | 48% |
| No. 2 | 29 nm | 44% |
| No. 3 | 33 nm | 0% |
| No. 4 | 35 nm | 0% |
| No. 5 | 31 nm | 36% |
| No. 6 | 26 nm | 52% |

Advantageous Effects of Embodiments

Some embodiments of the present disclosure provide an electronic device including a plurality of first electrodes that achieves a reduction in the leakage current between the plurality of first electrodes, and a reduction in the leakage current between such a first electrode and the second electrode.

While the present disclosure has been described with reference to example embodiments, it is to be understood that the disclosure is not limited to the disclosed example embodiments. The scope of the following claims is to be accorded the broadest interpretation so as to encompass all such modifications and equivalent structures and functions.

This application claims the benefit of Japanese Patent Application No. 2019-023783, filed Feb. 13, 2019, and 2019-210033, filed Nov. 20, 2019, which are hereby incorporated by reference herein in their entirety.

What is claimed is:

1. An electronic device comprising:
a first lower electrode;
a second lower electrode;
an upper electrode;
a functional layer disposed between each lower electrode and the upper electrode, and covering each lower electrode; and
an insulating layer covering an edge of each lower electrode, and including a slope portion on each lower electrode,
wherein each lower electrode includes a first region including the edge of the lower electrode and covered with the insulating layer, and a second region in contact with the functional layer,
the functional layer is continuously disposed so as to cover the second region of the first lower electrode, the second region of the second lower electrode, and the insulating layer covering the first lower electrode and the second lower electrode,
the functional layer has, on the second region, a layer thickness smaller than a height from an upper surface of the first lower electrode to an upper surface of the insulating layer, and
the functional layer on the slope portion of the insulating layer has a layer thickness of 33 nm or more in a direction perpendicular to a slope surface of the slope portion.

2. The electronic device according to claim 1, wherein a ratio of a distance between the second region of the first lower electrode and the second region of the second lower electrode to the layer thickness of the functional layer on the second region is less than 50.

3. The electronic device according to claim 1, wherein, in a section perpendicular to a main surface of the first lower electrode, the slope portion includes a gentle slope portion between an upper end of the slope portion and a lower end of the slope portion, and a steep slope portion disposed between the gentle slope portion and the lower end and having, relative to the first lower electrode, a larger slope angle than the gentle slope portion.

4. The electronic device according to claim 3, wherein the functional layer includes a charge transport layer in contact with the first lower electrode, a height of an upper surface of the charge transport layer on the second region of the first lower electrode is smaller than a height of an upper end of the steep slope portion, and
a height of an upper surface of the functional layer on the second region of the first lower electrode is larger than the height of the upper end of the steep slope portion.

5. The electronic device according to claim 1, further comprising a substrate on which each lower electrode is disposed, wherein, in plan view in a direction perpendicular to a main surface of the substrate, the slope portion and the first region of the first lower electrode overlap.

6. The electronic device according to claim 1, further comprising a substrate on which each lower electrode is disposed, wherein the insulating layer is covered with the functional layer and includes another slope portion disposed, in plan view in a direction perpendicular to a main surface of the substrate, between the first lower electrode and the second lower electrode, and
the functional layer on the other slope portion has a layer thickness of, in a direction perpendicular to the other slope portion, 20 nm or more.

7. The electronic device according to claim 1, the electronic device comprising a plurality of insulating layers including the insulating layer, which covers an edge of each lower electrode,
wherein each of the plurality of insulating layers includes a slope portion on each lower electrode, and the functional layer has a thickness of 20 nm or more in a direction perpendicular to the slope portion.

8. The electronic device according to claim 7, further comprising a substrate on which each lower electrode is disposed, wherein the plurality of insulating layers each include another slope portion disposed, in plan view in a direction perpendicular to a main surface of the substrate, between the first lower electrode and the second lower electrode, and, on the other slope portion, the functional layer has a thickness of 20 nm or more in a direction perpendicular to a slope surface of the other slope portion.

9. The electronic device according to claim 1, wherein the slope surface of the slope portion is not parallel to an upper surface of the first lower electrode, and
the slope surface of the slope portion is a portion of a surface of the insulating layer, the portion being disposed between an upper surface of the insulating layer and an upper surface of the first lower electrode covered with the insulating layer.

10. The electronic device according to claim 3, wherein the steep slope portion has a slope angle of more than 50° relative to the first lower electrode, and the gentle slope portion has a slope angle of 50° or less relative to the first lower electrode.

11. The electronic device according to claim 3, wherein the insulating layer includes the steep slope portion including a portion having a slope angle of more than 90° relative to the first lower electrode.

12. The electronic device according to claim 1, wherein the functional layer is an organic layer including a light emitting layer.

13. The electronic device according to claim 12, wherein the functional layer includes a charge transport layer in contact with the first lower electrode, the charge transport layer is a hole transport layer, and the light emitting layer is of an electron trap type.

14. A display apparatus comprising a plurality of pixels, wherein at least one of the plurality of pixels includes an electronic device, and a transistor connected to the electronic device,
wherein the electronic device includes
a first lower electrode,
a second lower electrode,
an upper electrode,
a functional layer disposed between each lower electrode and the upper electrode, and covering each lower electrode, and
an insulating layer covering an edge of each lower electrode, and including a slope portion on each lower electrode,
wherein each lower electrode includes a first region including the edge of the lower electrode and covered with the insulating layer, and a second region in contact with the functional layer, the functional layer is continuously disposed so as to cover the second region of the first lower electrode, the second region of the second lower electrode, and the insulating layer covering the first lower electrode and the second lower electrode, the functional layer has, on the second region, a layer thickness smaller than a height from an upper surface of the first lower electrode to an upper surface of the insulating layer, and the functional layer on the slope portion of the insulating layer has a layer thickness of 33 nm or more in a direction perpendicular to a slope surface of the slope portion.

15. A photoelectric conversion apparatus comprising:
an optical unit including a plurality of lenses;
an image pickup device configured to receive light having passed through the optical unit; and
a display unit configured to display an image captured with the image pickup device,
wherein the display unit includes an electronic device including a first lower electrode,
a second lower electrode,
an upper electrode,
a functional layer disposed between each lower electrode and the upper electrode, and covering each lower electrode, and
an insulating layer covering an edge of each lower electrode, and including a slope portion on each lower electrode,
wherein each lower electrode includes a first region including the edge of the lower electrode and covered with the insulating layer, and a second region in contact with the functional layer,
the functional layer is continuously disposed so as to cover the second region of the first lower electrode, the second region of the second lower electrode, and the insulating layer covering the first lower electrode and the second lower electrode,
the functional layer has, on the second region, a layer thickness smaller than a height from an upper surface of the first lower electrode to an upper surface of the insulating layer, and
the functional layer on the slope portion of the insulating layer has a layer thickness of 33 nm or more in a direction perpendicular to a slope surface of the slope portion.

16. An electronic apparatus comprising:
a display unit including an electronic device;
a housing provided with the display unit; and
a communication unit provided in the housing and configured to communicate with an external device,
wherein the electronic device includes
a first lower electrode,
a second lower electrode,
an upper electrode,
a functional layer disposed between each lower electrode and the upper electrode, and covering each lower electrode, and
an insulating layer covering an edge of each lower electrode, and including a slope portion on each lower electrode,
wherein each lower electrode includes a first region including the edge of the lower electrode and covered with the insulating layer, and a second region in contact with the functional layer,
the functional layer is continuously disposed so as to cover the second region of the first lower electrode, the second region of the second lower electrode, and the insulating layer covering the first lower electrode and the second lower electrode,
the functional layer has, on the second region, a layer thickness smaller than a height from an upper surface of the first lower electrode to an upper surface of the insulating layer, and
the functional layer on the slope portion of the insulating layer has a layer thickness of 33 nm or more in a direction perpendicular to a slope surface of the slope portion.

17. An illumination apparatus comprising:
a light source including an electronic device, and
a light diffusion unit or optical film configured to transmit light emitted from the light source,
wherein the electronic device includes
a first lower electrode,
a second lower electrode,
an upper electrode,
a functional layer disposed between each lower electrode and the upper electrode, and covering each lower electrode, and
an insulating layer covering an edge of each lower electrode, and including a slope portion on each lower electrode,
wherein each lower electrode includes a first region including the edge of the lower electrode and covered with the insulating layer, and a second region in contact with the functional layer,
the functional layer is continuously disposed so as to cover the second region of the first lower electrode, the second region of the second lower electrode, and the insulating layer covering the first lower electrode and the second lower electrode,
the functional layer has, on the second region, a layer thickness smaller than a height from an upper surface of the first lower electrode to an upper surface of the insulating layer, and
the functional layer on the slope portion of the insulating layer has a layer thickness of 33 nm or more in a direction perpendicular to a slope surface of the slope portion.

18. A moving object comprising:
an illumination unit including an electronic device; and
a body provided with the illumination unit,
wherein the electronic device includes
a first lower electrode,
a second lower electrode,
an upper electrode,
a functional layer disposed between each lower electrode and the upper electrode, and covering each lower electrode, and
an insulating layer covering an edge of each lower electrode, and including a slope portion on each lower electrode,
wherein each lower electrode includes a first region including the edge of the lower electrode and covered with the insulating layer, and a second region in contact with the functional layer,
the functional layer is continuously disposed so as to cover the second region of the first lower electrode, the second region of the second lower electrode, and the insulating layer covering the first lower electrode and the second lower electrode, the functional layer has, on the second region, a layer thickness smaller than a height from an upper surface of the first lower electrode to an upper surface of the insulating layer, and the functional layer on the slope portion of the insulating layer has a layer thickness of 33 nm or more in a direction perpendicular to a slope surface of the slope portion.

19. The electronic device according to claim 1, wherein a thickness of the functional layer at the second region is 100 nm or less.

* * * * *